US012721060B2

(12) United States Patent
Peterson et al.

(10) Patent No.: US 12,721,060 B2
(45) Date of Patent: Aug. 25, 2026

(54) GENERATION OF MULTILINE ETCH SUBSTRATES

(71) Applicant: Geminatio, Inc., Schenectady, NY (US)

(72) Inventors: Brennan Peterson, Longmont, CO (US); Phillip D. Hustad, Longmont, CO (US)

(73) Assignee: Geminatio, Inc., NY (US)

( * ) Notice: Subject to any disclaimer, the term of this patent is extended or adjusted under 35 U.S.C. 154(b) by 265 days.

(21) Appl. No.: 18/686,826

(22) PCT Filed: Aug. 25, 2022

(86) PCT No.: PCT/US2022/041546
§ 371 (c)(1),
(2) Date: Feb. 26, 2024

(87) PCT Pub. No.: WO2023/028244
PCT Pub. Date: Mar. 2, 2023

(65) Prior Publication Data

US 2025/0132166 A1 Apr. 24, 2025

Related U.S. Application Data

(60) Provisional application No. 63/236,850, filed on Aug. 25, 2021.

(51) Int. Cl.
*H10P 14/61* (2026.01)
*G03F 7/004* (2006.01)
(Continued)

(52) U.S. Cl.
CPC ............ *H10P 14/61* (2026.01); *G03F 7/0043* (2013.01); *H10P 76/204* (2026.01); *H10P 76/4085* (2026.01); *H10P 50/695* (2026.01)

(58) Field of Classification Search
CPC .... H10P 14/61; H10P 76/204; H10P 76/4085; H10P 50/695; G03F 7/0043; G03F 7/0752; G03F 7/405
See application file for complete search history.

(56) References Cited

U.S. PATENT DOCUMENTS

2009/0305167 A1* 12/2009 Kondoh .................... G03F 7/40 430/314
2015/0294878 A1 10/2015 deVilliers
(Continued)

OTHER PUBLICATIONS

International Search Report issued in Application No. PCT/US2022/041546, mailed on Dec. 16, 2022 (4 pages).
(Continued)

*Primary Examiner* — Anita K Alanko
(74) *Attorney, Agent, or Firm* — Osha Bergman Watanabe & Burton LLP

(57) ABSTRACT

A method of microfabrication includes providing a first relief pattern on a target layer, wherein the first relief pattern comprises a first resist having a first etch selectivity, coating the first relief pattern with a solubility-shifting agent, depositing a second resist on the first relief pattern, wherein the second resist has a second etch selectivity that is different from the first etch selectivity, diffusing the solubility-shifting agent into the second resist to provide a solubility-shifted region of the second resist, developing the second resist such that the solubility-shifted region is dissolved providing gaps between the first relief pattern and the second resist where a portion of the target layer is exposed, and filling the gaps between the first relief pattern and the second resist with a fill material.

18 Claims, 7 Drawing Sheets

(51) Int. Cl.
*H10P 76/20* (2026.01)
*H10P 76/40* (2026.01)
*H10P 50/00* (2026.01)

(56) References Cited

U.S. PATENT DOCUMENTS

2016/0062232 A1 3/2016 Hong et al.
2016/0181115 A1 6/2016 deVilliers
2016/0377982 A1 12/2016 deVilliers
2021/0088904 A1 3/2021 deVilliers et al.

OTHER PUBLICATIONS

Written Opinion issued in Application No. PCT/US2022/041546, mailed on Dec. 16, 2022 (6 pages).

* cited by examiner

GENERATION OF MULTILINE ETCH SUBSTRATES

CROSS REFERENCE TO RELATED APPLICATIONS

This application is a national stage application claiming priority to International Application Serial No. PCT/US2022/041546, entitled Generation of Multiline Etch Substrates, filed Aug. 25, 2023, hereby incorporated herein by reference.

BACKGROUND

Microfabrication of semiconductor devices includes various steps such as film deposition, pattern formation, and pattern transfer. Materials and films are deposited on a substrate by spin coating, vapor deposition, and other deposition processes. Pattern formation is typically performed by exposing a photo-sensitive film, known as a photoresist, to a pattern of actinic radiation and subsequently developing the photoresist to form a relief pattern. The relief pattern then acts as an etch mask, which, when one or more etching processes are applied to the substrate, cover portions of the substrate that are not to be etched.

Multi-patterning is a term that describes using more than one lithography step to create a final pattern. Multi-patterning, in different forms, enables the production of advanced semiconductor devices. Patterning typically includes two fundamental steps. The first step includes using lithography to create a pattern using mask-based exposure of light followed by development of soluble regions. The second step includes transferring the pattern into an underlying material by directional or anisotropic etching. These two steps together may be referred to as patterning a device.

To make advanced devices, a number of patterning steps may be used. For example, an area may be patterned with some form of multi-patterning, then cut between some regions using a cut mask. Some active areas may be "bridged" with a pattern that links different regions. Advanced pattern structures may be made using 5-6 exposures, which ideally do not interact, e.g., a bridge should not break the isolation of a different region. In order to achieve such advanced patterning, elaborate multi-step patterning processes have been developed. Typical multi-patterning schemes are complex, expensive, and difficult to convert at each step in the pattern process. Simplifying these steps would be beneficial by providing better throughput, time, and ultimately, shrink capability.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a method of microfabrication including providing a first relief pattern on a target layer, wherein the first relief pattern includes a first resist having a first etch selectivity, coating the first relief pattern with a solubility-shifting agent, depositing a second resist on the first relief pattern such that the second resist is in contact with the first relief pattern, wherein the second resist has a second etch selectivity that is different from the first etch selectivity, diffusing the solubility-shifting agent a predetermined distance into the second resist to provide a solubility-shifted region of the second resist, wherein the solubility-shifted region of the second resist borders the first relief pattern, developing the second resist such that the solubility-shifted region is dissolved providing gaps between the first relief pattern and the second resist where a portion of the target layer is exposed, and filling the gaps between the first relief pattern and the second resist with a fill material.

In another aspect, embodiments disclosed herein relate to a method of microfabrication including providing a first relief pattern on a target layer, wherein the first relief pattern includes a first resist having a first etch selectivity, coating the first relief pattern with a solubility-shifting agent, diffusing the solubility-shifting agent a predetermined distance into the first resist to provide a solubility-shifted region of the first resist, depositing a second resist on the first relief pattern such that the second resist is in contact with the first relief pattern, wherein the second resist has a second etch selectivity that is different from the first etch selectivity, developing the first resist such that the solubility-shifted region is dissolved providing gaps between the first relief pattern and the second resist where a portion of the target layer is exposed, and filling the gaps between the first relief pattern and the second resist with a fill material.

In one or more of the above embodiments, the target layer is an intermediate layer on top of a substrate.

In one or more of the above embodiments, the method further comprises: prior to filling the gaps between the first relief pattern and the second resist, transferring a pattern defined by the first relief pattern and the second resist to the target layer; and filling the gaps of the target layer with the fill material.

In one or more of the above embodiments, the first relief pattern comprises features separated by gaps between the features, wherein the features comprise the first resist.

In one or more of the above embodiments, the second resist fills the gaps of the first relief pattern.

In one or more of the above embodiments, the fill material is selected from the group consisting of polysilicon, silicon dioxide, and tungsten.

In one or more of the above embodiments, the method further comprises: removing the first relief pattern; transferring a pattern defined by the second resist and the fill material into the target layer; and filling the target layer with a second fill material.

In one or more of the above embodiments, the method further comprises: removing materials above the target layer.

In one or more of the above embodiments, the method further comprises: removing the second resist; transferring a pattern defined by the first resist and the fill material into the target layer; and filling the target layer with a second fill material.

In one or more of the above embodiments, the first resist comprises a metalorganic comprising metal oxide nanoparticles.

In one or more of the above embodiments, the second resist comprises a silicon-based resist.

In one or more of the above embodiments, the first resist comprises a polymer comprising monomeric units selected from the groups consisting of acrylate, methacrylate, p-hydroxystyrene, styrene, norbornene and combinations thereof.

In one or more of the above embodiments, the second resist comprises a metalorganic comprising metal oxide nanoparticles.

In one or more of the above embodiments, the second resist comprises a silicon-based resist.

In one or more of the above embodiments, the solubility-shifting agent comprises an acid generator. In one or more of the above embodiments, the acid generator is free of fluorine. In one or more of the above embodiments, the acid generator is selected from the group consisting of triphenylsulfonium antimonate pyridinium perfluorobutane sulfonate, 3-fluoropyridinium perfluorobutanesulfonate, 4-t-butylphenyltetramethylenesulfonium perfluoro-1-butane-sulfonate, 4-t-butylphenyltetramethylenesulfonium 2-trifluoromethylbenzenesulfonate, 4-t-butylphenyltetramethylenesulfonium 4,4,5,5,6,6-hexafluorodihydro-4H-1,3,2-dithiazine 1,1,3,3-tetraoxide, and combinations thereof.

In one or more of the above embodiments, the solubility-shifting agent comprises an acid. In one or more of the above embodiments, the acid is free of fluorine. In one or more of the above embodiments, the acid is selected from the group consisting of trifluoromethanesulfonic acid, perfluoro-1-butanesulfonic acid, p-toluenesulfonic acid, 4-dodecylbenzenesulfonic acid, 2,4-dinitrobenzenesulfonic acid, 2-trifluoromethylbenzenesulfonic acid, and combinations thereof.

In one or more of the above embodiments, the solubility-shifting agent comprises a matrix polymer comprising monomers with ethylenically unsaturated polymerizable double bonds, including (meth)acrylate monomers; (meth) acrylic acids; vinyl aromatic monomers such as styrene, hydroxystyrene, vinyl naphthalene and acenaphthylene; vinyl alcohol; vinyl chloride; vinyl pyrrolidone; vinyl pyridine; vinyl amine; vinyl acetal; maleic anhydride; maleimides; norbornenes; and combinations thereof.

In one or more of the above embodiments, the solubility-shifting agent comprises a matrix polymer comprising monomers comprising one or more functional groups chosen from hydroxy, carboxyl, sulfonic acid, sulfonamide, silanol, fluoroalcohol, anhydrates, lactones, esters, ethers, allylamine, pyrrolidones, and combinations thereof.

In one or more of the above embodiments, the method further comprises, directly after coating the first relief pattern with the solubility-shifting agent, diffusing the solubility-shifting agent into the first relief pattern.

In one or more of the above embodiments, diffusing the solubility-shifting agent into the first relief pattern is achieved by performing a bake.

Other aspects and advantages of the claimed subject matter will be apparent from the following description and the appended claims.

DETAILED DESCRIPTION

In multi-patterning of a substrate, an initial pattern formation should generate patterns that can be accurately placed into a target layer. Initial patterns may be formed using various different layers. The various different layers should be sufficiently different, so that each layer may be selectively formed into a final substrate or structure. Selective formation of each layer may be achieved using techniques such as multiline layer or multicolor layer. A multiline layer is a plane or layer of two or three different alternating materials. Each of the materials may be selected so that it can be etched without etching the other materials. Selective etching achieved such technique is usually not perfect, but sufficient. For example, one material may be fully etched while the other material(s) is only partially etched, thus still providing masking of underlying layers.

Figure 1:
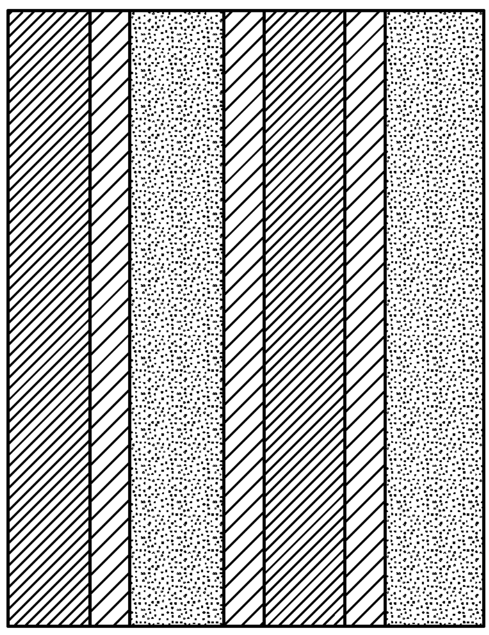
FIG. 1 is a schematic illustration of a multiline layer in accordance with one or more embodiments of the present disclosure.

A preferred multiline layer is the "ABC" layout. This layer has three different materials (A, B, and C) that alternate, typically in a sequence of ABCBA, such that material B appears in every other position while materials A and C have three intervening lines before repeating. FIG. 1 shows an exemplary multiline layer according to the ABC pattern.

With such multiline layer, the A or C material may be etched independently, enabling the formation of more complex patterns for modern devices. Additionally, the multiline layer may be masked, creating openings. Such openings may be wider than needed, but because of the distinct material in the multiline layer having different etch resistivities, an etch using the etch mask may be further confined. For example, using a relatively large pattern above C that is wider than desired, a directional etch of C will not create an opening where A and B appear. Thus, a buffer zone is essentially provided. Having an ABC pattern dramatically simplifies lithography and etch requirements for making complex patterns.

Figure 2:
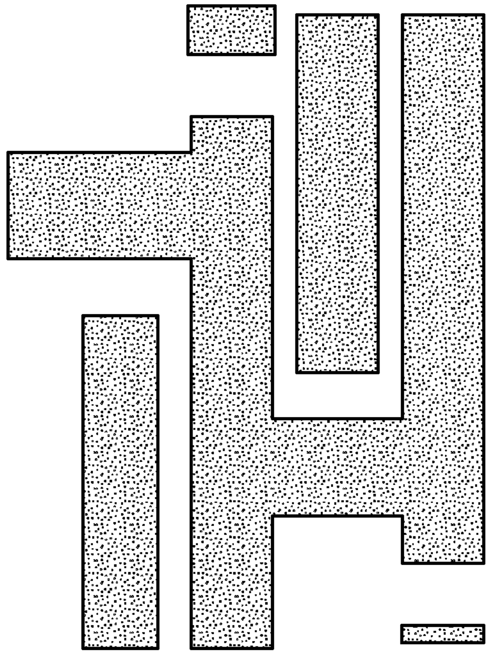
FIG. 2 is a schematic illustration of a patterned multiline layer in accordance with one or more embodiments of the present disclosure.

FIG. 2 shows an example where precise breaks in a final pattern (not necessarily C material) and precise crosses are formed. Without the C region, the perfection required is beyond the resolution capability of conventional tools. Accordingly, conventional multi-patterning relies on protections, composite patterns, and local patterns. This is sometimes needed because vapor phase etch can have low selectivity between different materials depending on the materials. In some design, only two patterns are needed: A/C and B. This means that A and C can be a same material or have essentially similar etch properties. The A/C scheme allows some degree of cut (break A or C) and bridge (break B) patterns.

Although multiline layers are useful in patterning, one drawback is the process time and expense for creating an ABC pattern. Conventionally, this pattern is created using inorganic or relatively hard materials. For example, a resist mask may be used to etch and create lines or mandrels (A material). The resist may then be removed from the substrate, after which, a conformal deposition may be executed, typically using chemical vapor deposition (CVD) or atomic layer deposition (ALD). Then, a spacer etch process may be executed. A spacer etch process may directionally etch the conformal material from horizontal surfaces, leaving sidewall depositions (B material). A fill material may then be deposited which fills openings between sidewall spacers (C material). Overburden of the fill material may be removed by controlled etching or chemical-mechanical polishing. Thus, such multiline layer creation involves a scanner/stepper, coater-developer (track tool), deposition chamber, etch chamber, and CMP tool. Accordingly, the cost and time of such patterning is relatively high.

The present disclosure generally relates to a method of multi-patterning a semiconductor substrate. Herein, the terms "semiconductor substrate" and "substrate" are used interchangeably, and may be any semiconductor material including, but not limited to, semiconductor wafers, semiconductor material layers, and combinations thereof. In one or more embodiments, the method includes forming a multiline layer out of resist materials, rather than the hardmask materials that are used in conventional methods. Accordingly, methods of one or more embodiments may be applied to advanced lithography techniques primarily using track tools. Resist-based multiline layers disclosed herein may enable access to sub-resolution patterns at reduced time and cost.

In one or more embodiments, methods include converting typical polymer patterns to ABC or AB compatible etch patterns with etch independent materials. Methods may include using negative spacer flows (anti-spacer flows), which may allow effective cut and bridge pattern formation. In particular embodiments, an anti-spacer flow having a pattern including two polymers with a space between is formed and used to provide an ABC patterned multiline layer. A method, 300, according to such embodiment is shown in, and discussed with reference to, FIG. 3.

Figure 3:
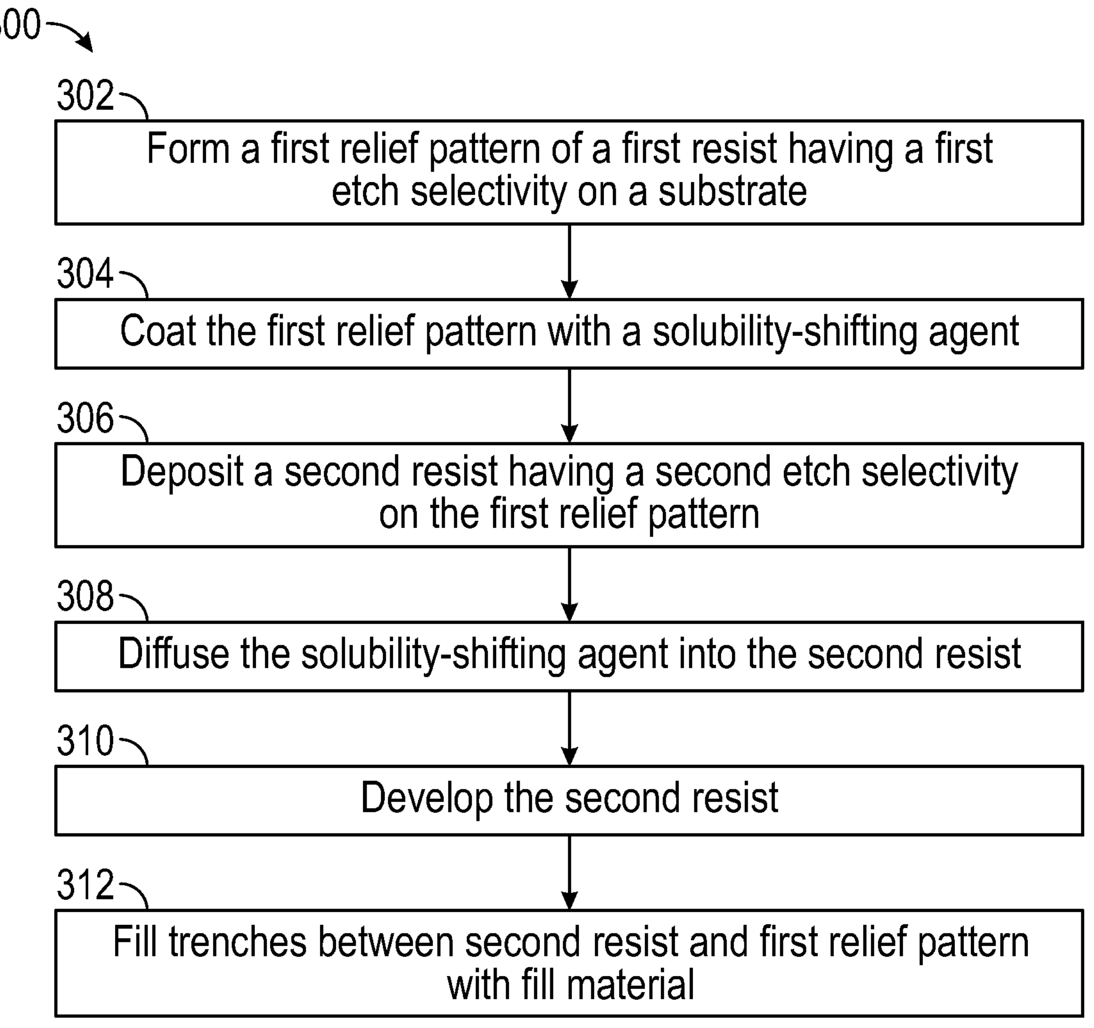
FIG. 3 is a block-flow diagram of a method in accordance with one or more embodiments of the present disclosure.

In a negative spacer or anti-spacer flow, an initial pattern of resist is provided on a substrate, shown at block 302 of FIG. 3. Herein, the initial pattern of resist may also be referred to as an initial relief pattern. In one or more embodiments, one or more intermediate layers may be positioned between the initial relief pattern and an underlying target layer. Suitable intermediate layers include hard mask layers and bottom antireflective coating layers (BARC), among others. The target layer may be a suitable layer such as one used in the art to receive a pattern. The initial relief pattern may include a first resist that has a first etch selectivity. Then, at block 304, a chemical exposure material or diffusion agent is deposited on the patterned resist. Herein, the terms "diffusion agent" and "solubility-shifting agent" may be used interchangeably to describe an agent that diffuses into, and alters the solubility of, a first or second resist. For deposition of the diffusion agent, the diffusion agent (e.g., an acid) may be coated on the first relief pattern. Next, at block 306, a second resist or solubility-shiftable polymer is deposited on the substrate to fill openings defined by the first resist. The second resist may have a second etch selectivity that is distinct from the first etch selectivity of the first resist. That is, although there are some etchants (etch chemical combinations) that will etch both materials, there are other etchants that will etch the first resist or the second resist without etching the other resist. The resist that is more etch resistant can be selected based on patterning goals or designs and can thus be customized. At block 308, diffusion is initiated into the second resist or polymer. Diffusion may be heat activated. The solubility-shifting agent may comprise a photo-sensitive compound that generates the solubility-shifting agent upon exposure to actinic radiation. The amount of diffusion into the second resist may be precisely controlled on a nanometer scale by the time and temperature of the process. Such control may enable feature dimensions much smaller than conventional lithography resolution. For example, 193 nm lithography tools can comfortably print features with widths of 193 nm and larger. With some optical tricks, lines can be printed down to about 80 nm. Acid diffusion, however, can be controlled to within a few nanometers.

After acid diffusion, a region between the first resist and the second resist is now soluble and can be removed by developing chemicals. At block 310, the soluble region, also referred to as a solubility-shifted region of the second resist, may be developed using specific developing chemicals, creating a space (negative spacer or anti-spacer) around the first resist. Then, by relying on the distinct etch selectivities, or etch resistivities, of the first and second resists, the substrate may be selectively etched with a complex pattern, at block 310 of method 300. The result of this patterning type is a resist, or two different resists, with narrow gaps separating them. To create a high selectivity pattern, the second resist may have a significantly different composition from the first resist. Finally, at block 312 the gaps are filled with a fill material to provide an ABC patterned multiline layer.

Figure 4A:
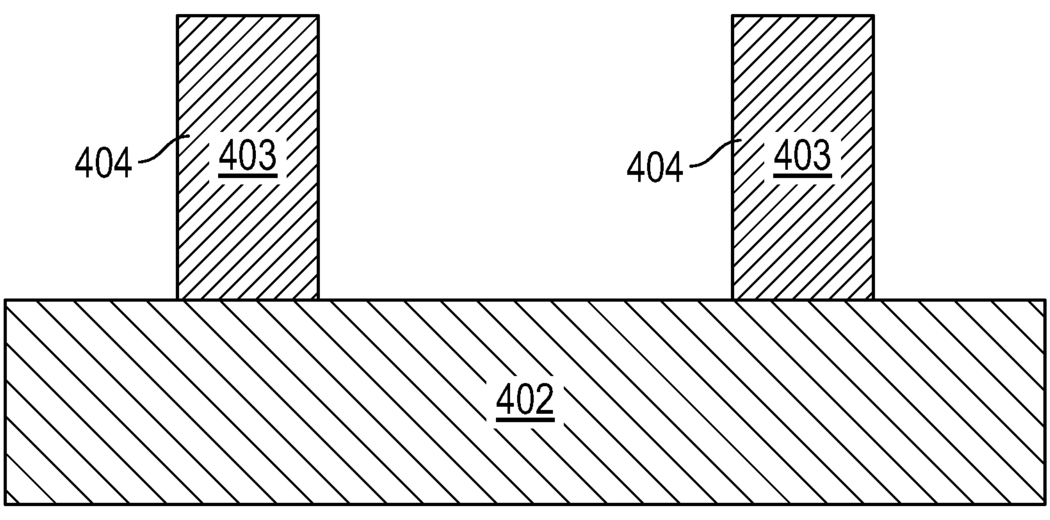
FIGS. 4A-F are schematic illustrations of coated substrates at respective points of a method in accordance with one or more embodiments of the present disclosure.
Figure 4B:
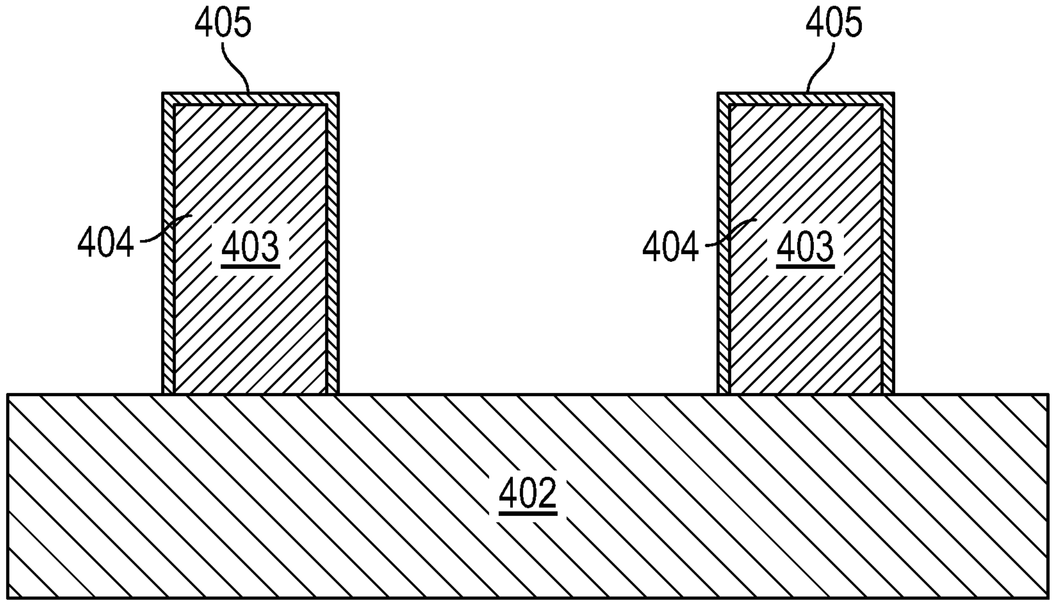
Figure 4C:
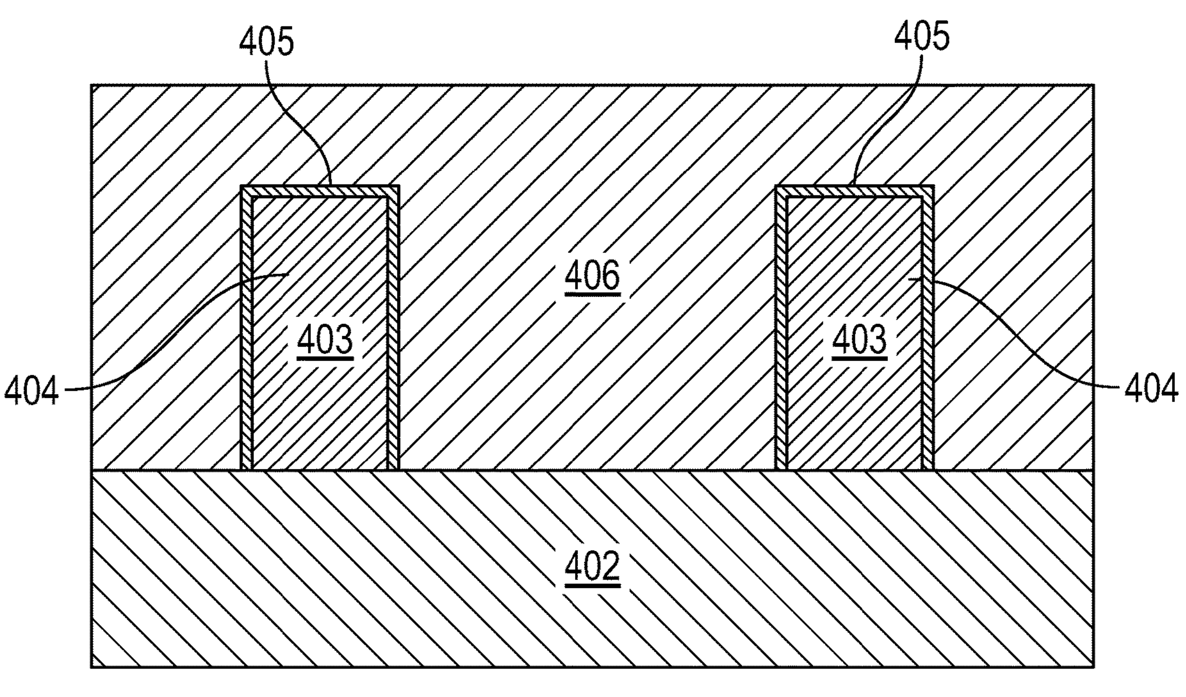
Figure 4D:
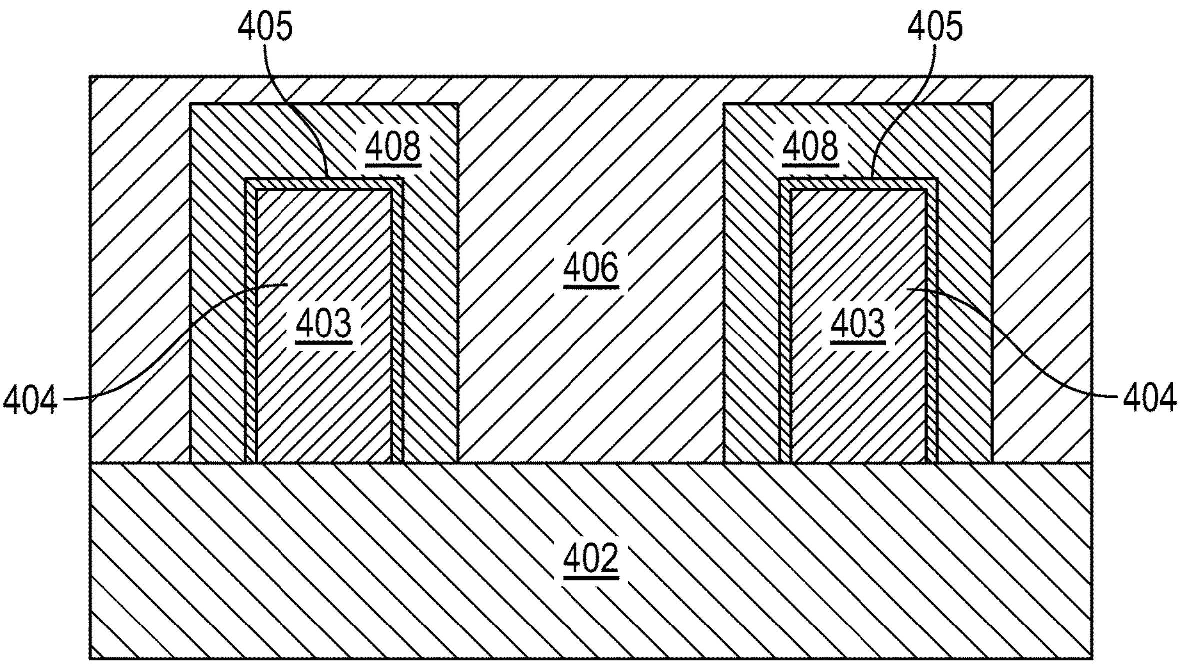
Figure 4E:
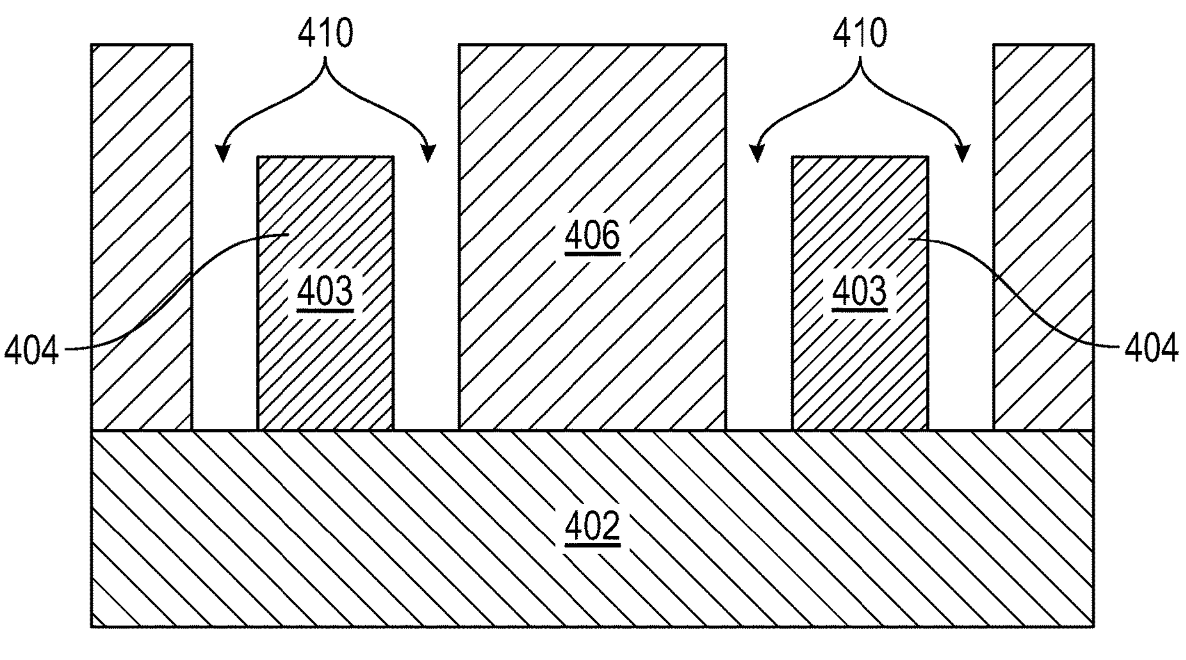
Figure 4F:
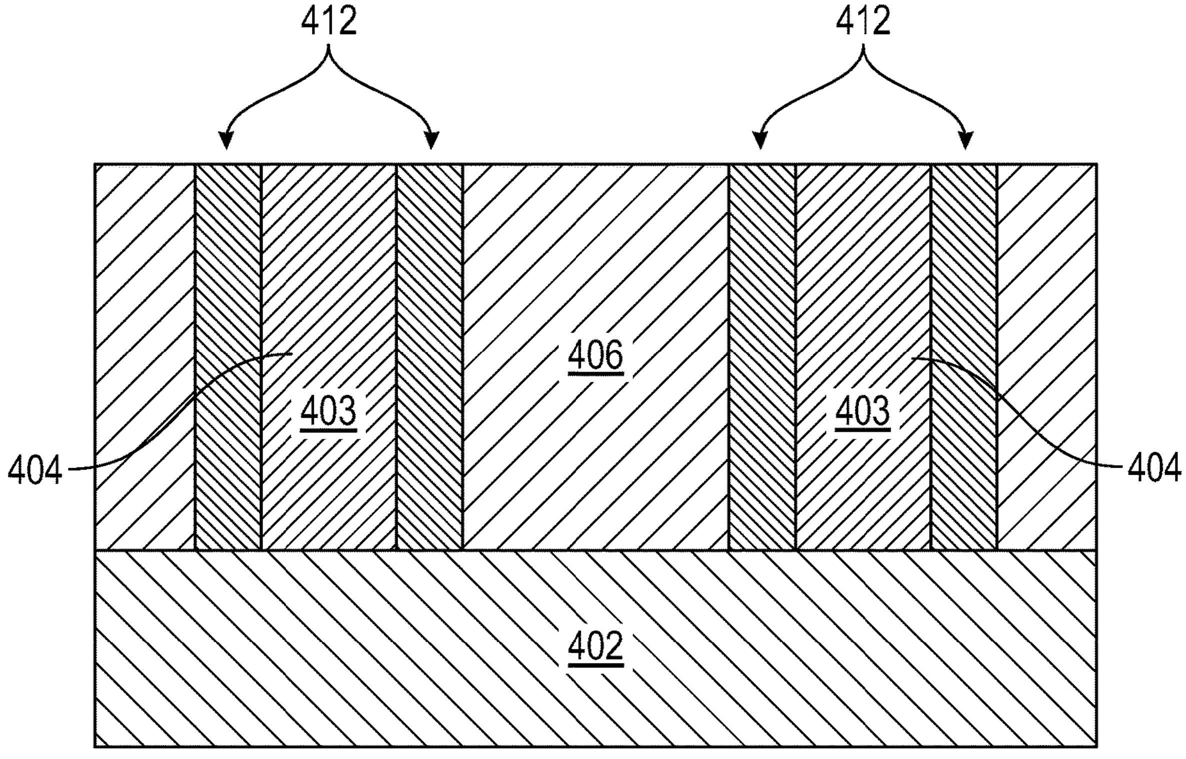

Schematic depictions of a coated substrate at various points during the method described above are shown in FIGS. 4A-E. Herein "a coated substrate" refers to a substrate that is coated with one or more layers, such as a first resist layer and a second resist layer. The coated substrate may initially be coated with a target layer. FIG. 4A shows a target layer including a first relief pattern. FIG. 4B shows a target layer including a first relief pattern coated with a solubility-shifting agent. In FIG. 4C, a second resist is layered over the substrate and the first relief pattern. FIG. 4D shows a coated substrate after the solubility-shifting agent has been diffused into the second resist. Finally, FIG. 4E shows a coated substrate after the second resist has been developed, such that trenches are formed between the second resist and the first relief pattern. Finally, FIG. 4F shows a target layer where the trenches between the second resist and the first relief pattern have been filled with a fill material to provide an ABC patterned multiline layer. The method of FIG. 3 and coated substrates shown in FIGS. 4A-F are discussed in detail below.

At block 302 of method 300, a first relief pattern is provided. FIG. 4A shows an example of a first relief pattern 404 on a target layer 402. The target layer may be a substrate or any other suitable layer that may receive a pattern. As shown in FIG. 4A, the first relief pattern may include features separated by gaps. Portions of the target layer may be exposed by the presence of the gaps of the first relief pattern. The features of the first relief pattern may be made of a first resist 403. The first resist may be a photoresist. Generally, a photoresist is a chemically amplified photosensitive composition that comprises a polymer, a photoacid generator, and a solvent. For example, the polymer may be a polymer made from monomers including vinyl aromatic monomers such as styrene and p-hydroxystyrene, acrylate, methacrylate, norbornene, and combinations thereof. Monomers that include reactive functional groups may be present in the polymer in a protected form. For example, the —OH group of p-hydroxystyrene may be protected with a tert-butyloxycarbonyl protecting group. Such protecting group may alter the reactivity and solubility of the polymer included in the first resist. As will be appreciated by one having ordinary skill in the art, various protecting groups may be used for this reason. Acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-decomposable groups", "acid-cleavable groups," "acid-cleavable protecting groups," "acid-labile protecting groups," "acid-leaving groups," and "acid-sensitive groups."

The acid-labile group which, on decomposition, forms a carboxylic acid on the polymer is preferably a tertiary ester group of the formula —C(O)OC(R1)3 or an acetal group of the formula —C(O)OC(R2)2OR3, wherein: R1 is each independently linear C1-20 alkyl, branched C3-20 alkyl, monocyclic or polycyclic C3-20 cycloalkyl, linear C2-20 alkenyl, branched C3-20 alkenyl, monocyclic or polycyclic C3-20 cycloalkenyl, monocyclic or polycyclic C6-20 aryl, or monocyclic or polycyclic C2-20 heteroaryl, preferably linear C1-6 alkyl, branched C3-6 alkyl, or monocyclic or polycyclic C3-10 cycloalkyl, each of which is substituted or unsubstituted, each R1 optionally including as part of its structure one or more groups chosen from —O—, —C(O)—, —C(O)—O—, or —S—, and any two R1 groups together optionally forming a ring; R2 is independently hydrogen, fluorine, linear C1-20 alkyl, branched C3-20 alkyl, monocyclic or polycyclic C3-20 cycloalkyl, linear C2-20 alkenyl, branched C3-20 alkenyl, monocyclic or polycyclic C3-20 cycloalkenyl, monocyclic or polycyclic C6-20 aryl, or monocyclic or polycyclic C2-20 heteroaryl, preferably hydrogen, linear C1-6 alkyl, branched C3-6 alkyl, or monocyclic or polycyclic C3-10 cycloalkyl, each of which is substituted or unsubstituted, each R2 optionally including as part of its structure one or more groups chosen from —O—, —C(O)—, —C(O)—O—, or —S—, and the R2 groups together optionally forming a ring; and R3 is linear C1-20 alkyl, branched C3-20 alkyl, monocyclic or polycyclic C3-20 cycloalkyl, linear C2-20 alkenyl, branched C3-20 alkenyl, monocyclic or polycyclic C3-20 cycloalkenyl, monocyclic or polycyclic C6-20 aryl, or monocyclic or polycyclic C2-20 heteroaryl, preferably linear C1-6 alkyl, branched C3-6 alkyl, or monocyclic or polycyclic C3-10 cycloalkyl, each of which is substituted or unsubstituted, R3 optionally including as part of its structure one or more groups chosen from —O—, —C(O)—, —C(O)—O—, or —S—, and one R2 together with R3 optionally forming a ring. Such monomer is typically a vinyl aromatic, (meth) acrylate, or norbornyl monomer. The total content of polymerized units comprising an acid-decomposable group which forms a carboxylic acid group on the polymer is typically from 10 to 100 mole %, more typically from 10 to 90 mole % or from 30 to 70 mole %, based on total polymerized units of the polymer.

The polymer can further include as polymerized a monomer comprising an acid-labile group, the decomposition of which group forms an alcohol group or a fluoroalcohol group on the polymer. Suitable such groups include, for example, an acetal group of the formula —COC(R2)2OR3-, or a carbonate ester group of the formula —OC(O)O—, wherein R is as defined above. Such monomer is typically a vinyl aromatic, (meth)acrylate, or norbornyl monomer. If present in the polymer, the total content of polymerized units comprising an acid-decomposable group, the decomposition of which group forms an alcohol group or a fluoroalcohol group on the polymer, is typically from 10 to 90 mole %, more typically from 30 to 70 mole %, based on total polymerized units of the polymer.

In another embodiment, the polymer may be a polymer that contains a silicon-containing unit that can be chemically bonded to the polymeric material. In a preferred embodiment, the silicon-containing unit includes silicon-oxygen bonds. Resists that include such polymers may be referred to herein as "silicon-based resists." Examples of silicon-containing resist are disclosed in U.S. Pat. Nos. 5,985,524, 6,444,408, 6,670,093; 6,596,830; as well as by Schaedeli et al., "Bilayer Resist Approach for 193 nm Lithography", Proc. SPIE, Vol. 2724, pp. 344-354, 1996; and Kessel et al, "Novel Silicon-Containing Resists for EUV and 193 nm Lithography", Proc. SPIE, Vol. 3678, pp. 214-220, 1999.

The first resist of one or more embodiments is a metalorganic or metal-based resist based on metal oxide chemistry, including metal oxo/hydroxo compositions that utilize radiation sensitive ligands to enable patterning with actinic radiation. One class of radiation-based resists use peroxo ligands as the radiation sensitive stabilization ligands. Peroxo based metal oxo-hydroxo compounds are described, for example, in U.S. Pat. No. 9,176,377B2 to Stowers et al., entitled "Patterned Inorganic Layers, Radiation Based Patterning Compositions and Corresponding Methods," incorporated herein by reference. Related resist compounds are discussed in published U.S. patent application 2013/0224652A1 to Bass et al., entitled "Metal Peroxo Compounds With Organic Co-ligands for Electron Beam, Deep UV and Extreme UV Resist Applications," incorporated herein by reference. An effective type of resists have been developed with alkyl ligands as described in U.S. Pat. No. 9,310,684B2 to Meyers et al., entitled "Organometallic Solution Based High Resolution Patterning Compositions," published U.S. patent application 2016/0116839A1 to Meyers et al., entitled "Organometallic Solution Based High Resolution Patterning Compositions and Corresponding Methods," and U.S. patent application Ser. No. 15/291,738 entitled "Organotin Oxide Hydroxide Patterning Compositions, Precursors, and Patterning", all of which are incorporated herein by reference. Tin compositions are exemplified in these documents, and the data presented herein focuses on tin-based resists, although the Edge bead removal solutions described herein are expected to be effective for other metal-based resists described below.

With respect to the tin based resists of particular interest, these resists are based on the chemistry of organometallic compositions represented by the formula RzSnO(2-(z/2)-(x/2))(OH)x where $0<z\leq 2$ and $0<(z+x)\leq 4$, in which R is a hydrocarbyl group with 1-31 carbon atoms. However, it has been found that at least some of the oxo/hydroxo ligands can be formed following deposition based on in situ hydrolysis based on compositions represented by the formula RnSnX4-n where n=1 or 2, in which X is a ligand with a hydrolysable M-X bond. In general, suitable hydrolysable ligands (X in RSnX3) may include alkynides RC≡C, alkoxides RO—, azides N3-, carboxylates RCOO—, halides and dialkylamides. Thus, in some embodiments all or a portion for the oxo-hydroxo compositions can be substituted with the Sn—X compositions or a mixture thereof. The R—Sn bonds generally are radiation sensitive and form the basis for the radiation processable aspect of the resist. But some of the RzSnO(2-(z/2)-(x/2))(OH)x composition can be substituted with MO((m/2)-1/2)(OH)x where $0<z\leq 2$, $0<(z+w)\leq 4$, m=formal valence of Mm+, $0\leq l\leq m$, y/z=(0.05 to 0.6), and M=M' or Sn, where M' is a non-tin metal of groups 2-16 of the periodic table, and R is hydrocarbyl groups with 1-31 carbon atoms. Thus the resist being processed during the edge bead rinse can comprise a selected blend of RzSnO(2-(z/2)-(x/2))(OH)x, R'nSnX4-n, and/or MO((m/2)-1/2)(OH)x, in which generally a significant fraction of the composition includes alkyl-tin bonds. Other resist compositions include, for example, compositions having metal carboxylate bonds (e.g., ligands of acetate, propanoate, butanoate, benzoate, and/or the like), such as dibutyltin diacetate.

While metal oxo/hydroxo or carboxylate-based resists referenced above are particularly desirable, some other high-performance resists may be suitable in some embodiments. Specifically, other metal-based resists include those with high etch selectivity to the template, fill material, and buffer hardmask. These may include resists such as metal-oxide nanoparticle resists (e.g., Jiang, Jing; Chakrabarty, Souvik; Yu, Mufei; et al., "Metal Oxide Nanoparticle Resists for EUV Patterning", Journal Of Photopolymer Science And Technology 27(5), 663-666 2014, incorporated herein by reference), or other metal containing resists (A Platinum-Fullerene Complex for Patterning Metal Containing Nanostructures, D. X. Yang, A. Frommhold, D. S. He, Z. Y. Li, R. E. Palmer, M. A. Lebedeva, T. W. Chamberlain, A. N. Khlobystov, A. P. G. Robinson, Proc SPIE Advanced Lithography, 2014, incorporated herein by reference). Other metal-based resists are described in published U.S. patent application 2009/0155546A1 to Yamashita et al., entitled "Film-Forming Composition, Method for Pattern Formation, and Three-Dimensional Mold," and U.S. Pat. No. 6,566,276 to Maloney et al., entitled "Method of Making Electronic Materials," both of which are incorporated herein by reference.

In embodiments in which the first resist is a photoresist, the first resist includes a photoacid generator. The photoacid generator is a compound capable of generating an acid upon irradiation with actinic rays or radiation. The photoacid generator may be selected from known compounds capable of generating an acid upon irradiation with actinic rays or radiation which are used for a photoinitiator for cationic photopolymerization, a photoinitiator for radical photopolymerization, a photodecoloring agent for dyes, a photodiscoloring agent, a microresist, or the like, and a mixture thereof can be used. Examples of the photoacid generator include a diazonium salt, a phosphonium salt, a sulfonium salt, an iodonium salt, imidosulfonate, oxime sulfonate, diazodisulfone, disulfone, and o-nitrobenzyl sulfonate.

Suitable photoacids include onium salts, for example, triphenylsulfonium trifhioromethanesulfonate, (p-tert-butoxyphenyl)diphenylsulfonium trifhioromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerized photoacid generators are further described in U.S. Pat. No. 8,431,325 to Hashimoto et al. in column 37, lines 11-47 and columns 41-91. Other suitable sulfonate PAGs include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325. PAGs that are onium salts typically comprise an anion having a sulfonate group or a non-sulfonate type group, such as a sulfonamidate group, a sulfonimidate group, a methide group, or a borate group.

The resist composition may optionally comprise a plurality of PAGs. The plural PAGs may be polymeric, non-polymeric, or may include both polymeric and non-polymeric PAGs. Preferably, each of the plurality of PAGs is non-polymeric. Preferably, when a plurality of PAGs are used, a first PAG comprises a sulfonate group on the anion and a second PAG comprises an anion that is free of sulfonate groups, such anion containing for example, a sulfonamidate group, a sulfonimidate group, a methide group, or a borate group such as described above.

In one or more embodiments, the first resist may have a first etch selectivity, such that it may be etched more or less easily than another resist. Etching of the resist is typically conducted by anisotropic dry-etching, such as reactive ion etching, with the etch chemistries being dependent on the particular materials making up the layers. The speed of the etching process for a material, or etch rate, is dependent on the composition of the material and the etchant and various process conditions. For example, organic compositions can be etched at high rates with oxygen plasma but are resistant to etch using fluorine containing etchants. Silicon-containing compositions may have increasing etch resistance to oxygen plasma with increasing silicon content. Polymers high in silicon generally have high resistance to oxygen plasma reactive ion etching but can be etched with fluorine containing etchants. Metals similarly impart differential etch selectivity to metal-containing resists.

In some embodiments, the first resist includes an etch resistance enhancer. Inclusion of a suitable etch resistant enhancer may increase the first resists resistance to etching, as described above.

The first relief pattern may be formed by layering the first resist onto a target layer and the developing the first resist. The first resist may be developed according to procedures known in the art, e.g., exposure to actinic radiation followed by rinsing with a first resist developer. In order to impart a shape, or relief pattern, in the developed resist, a mask may be used to block a portion of the resist from the actinic radiation. After the actinic radiation is applied, the unexposed portion of the resist may have a different solubility than the exposed portion of the resist. Subsequent rinsing with the first resist developer will dissolve either the unexposed portion or the exposed portion. A relief pattern provided when the unexposed portion of the resist remains after rinsing with a developer is a positive tone developed resist. In contrast, a relief pattern provided when the exposed portion of the resist remains after rinsing with a developer is a negative tone developed resist.

In one or more embodiments, the first resist is a negative resist. In such embodiments, the first relief pattern may include a polymer made from the above-described monomers, wherein any monomers including a reactive functional group are not protected. Exposure to actinic radiation results in crosslinking of the polymer in areas of exposure, rendering the polymer insoluble to developers. The unexposed and thus uncrosslinked areas can then be removed using an appropriate developer to form the relief pattern. The negative resist may also be a metalorganic or metal-based resist.

In other embodiments, the first resist is a negative tone developed (NTD) resist. NTD resists may include a polymer made from the above-described monomers, wherein any monomers including a reactive functional group are protected. As such, a NTD first resist may be organic soluble, but instead of developing the exposed areas with a first resist developer that is basic, the first relief pattern may be provided by rinsing the first resist with a first resist developer including an organic solvent. Suitable organic solvents that may be used as a first resist developer include n-butyl acetate (NBA) and 2-heptanone. The tone of the resist (i.e., negative vs. NTD) may influence the subsequent chemistry applied to the first relief pattern.

As previously described, the first relief pattern may include features separated by gaps. In one or more embodiments, the features of the first relief pattern may have a thickness of about 300 Å to about 3000 Å. The gaps separating the features may leave portions of the substrate exposed.

At block 304 of method 300, the first relief pattern is coated with a solubility-shifting agent. A coated substrate in accordance with block 304 is shown in FIG. 4B. The solubility-shifting agent 405 is shown as a thin coating over the first relief pattern 404. The thickness of the solubility-shifting agent coating is not particularly limited and may be altered based on the desired line cut width. The solubility-shifting agent may be a material that is absorbed into the first resist via a bake, and in some instances herein may be referred to as an "absorbed material." The process of absorbing, or diffusing, the solubility-shifting agent into the first resist is described in detailed below.

The composition of the solubility-shifting agent may depend on the tone of the first and second resists. Generally, the solubility-shifting agent may be any chemical that activates with light or heat. For example, when the second resist includes a chemically amplified resist, the solubility-shifting agent may include an acid or thermal acid generator (TAG). The acid or generated acid in the case of a TAG should be sufficient with heat to cause cleavage of the bonds of acid-decomposable groups of the polymer in a surface region of the first resist pattern to cause increased solubility of the first resist polymer in a specific developer to be applied. The acid or TAG is typically present in the composition in an amount of from about 0.01 to 20 wt % based on the total solids of the trimming composition.

Preferable acids are organic acids including non-aromatic acids and aromatic acids, each of which can optionally have fluorine substitution. Suitable organic acids include, for example: carboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxyalkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, and 1-heptanesulfonic acid.

Exemplary aromatic acids that are free of fluorine include wherein aromatic acids of the general formula (I):

(I)

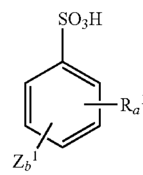

wherein: R1 independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z1 independently represents a group chosen from carboxyl, hydroxy, nitro, cyano, C1 to C5 alkoxy, formyl and sulfonic acid; a and b are independently an integer from 0 to 5; and a+b is 5 or less.

Exemplary aromatic acids may be of the general formula (II):

(II)

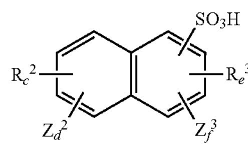

wherein: R2 and R3 each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; Z2 and Z3 each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less.

Additional aromatic acids that may be included in the solubility-shifting agent include those the general formula (III) or (IV):

(III)

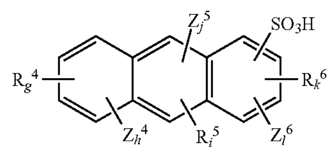

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+l is 3 or less;

(IV)

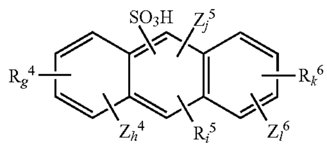

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; and k+l is 4 or less.

Suitable aromatic acids may alternatively be of the general formula (V):

(V)

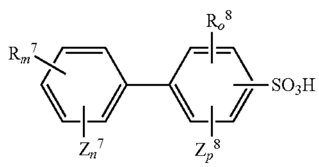

wherein: R7 and R8 each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; Z7 and Z8 each independently represents a group chosen from hydroxy, nitro, cyano, C1 to C5 alkoxy, formyl and sulfonic acid; m and n are independently an integer from 0 to 5; m+n is 5 or less; o and p are independently an integer from 0 to 4; and o+p is 4 or less.

Additionally, exemplary aromatic acids may have the general formula (VI):

(VI)

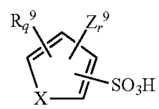

wherein: X is O or S; R9 independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z9 independently represents a group chosen from carboxyl, hydroxy, nitro, cyano, C1 to C5 alkoxy, formyl and sulfonic acid; q and r are independently an integer from 0 to 3; and q+r is 3 or less.

In one or more embodiments, the acid is a free acid having fluorine substitution. Suitable free acids having fluorine substitution may be aromatic or nonaromatic. For example, free acid having fluorine substitution that may be used as solubility-shifting agent include, but are not limited to the following:

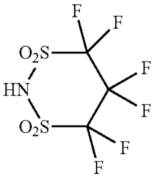
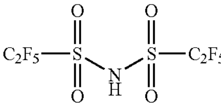
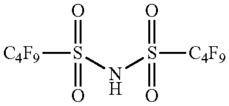
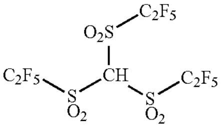
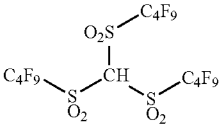
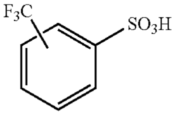
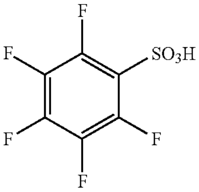
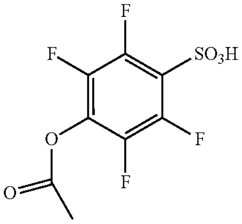
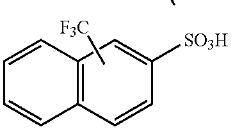
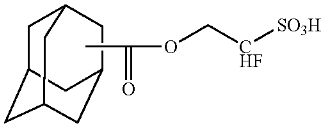
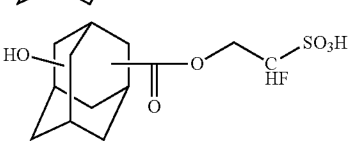
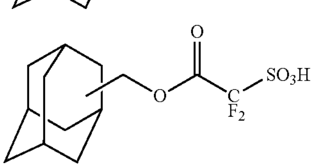
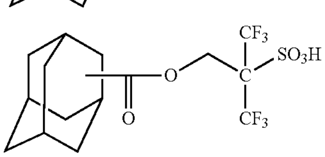
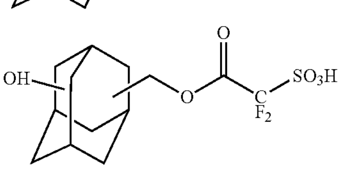

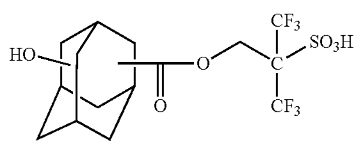
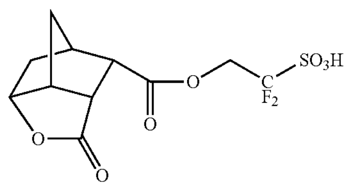
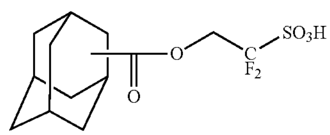
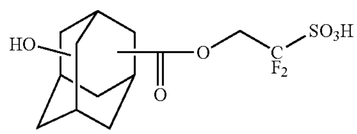
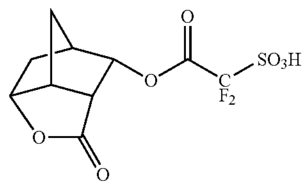
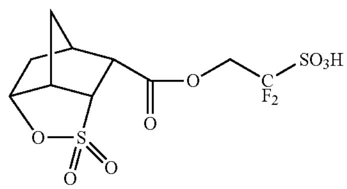
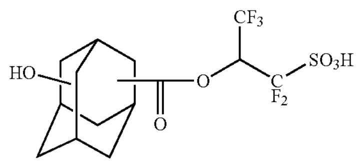
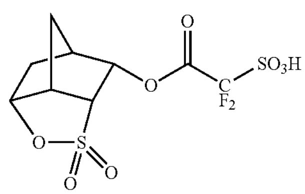
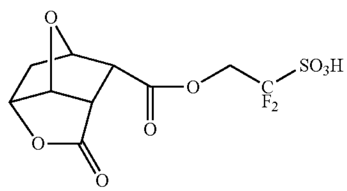
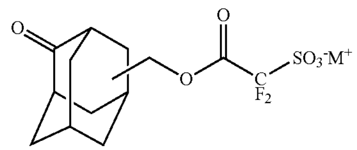
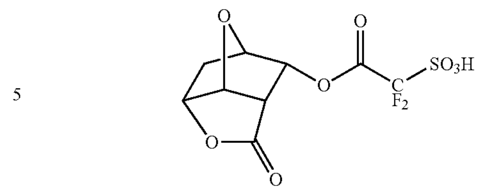
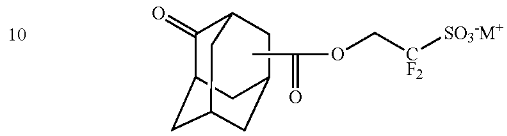
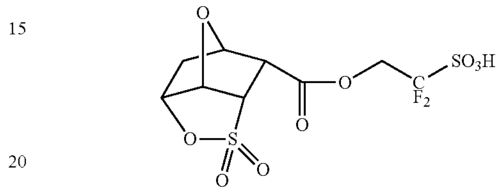
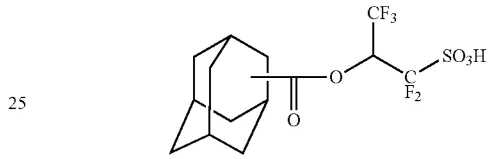
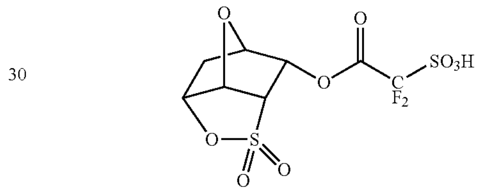
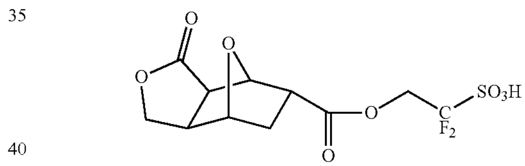
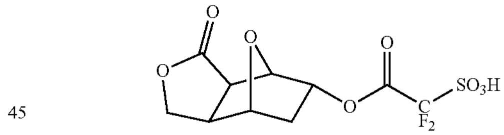
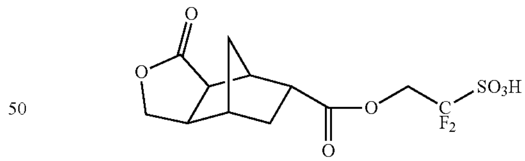
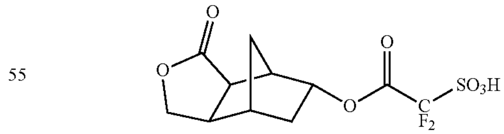
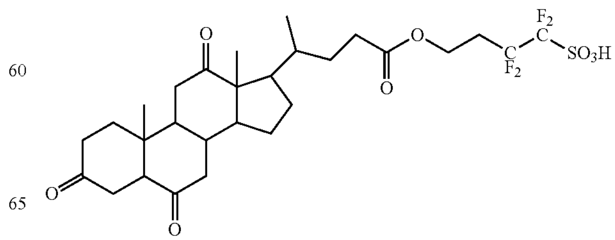

-continued

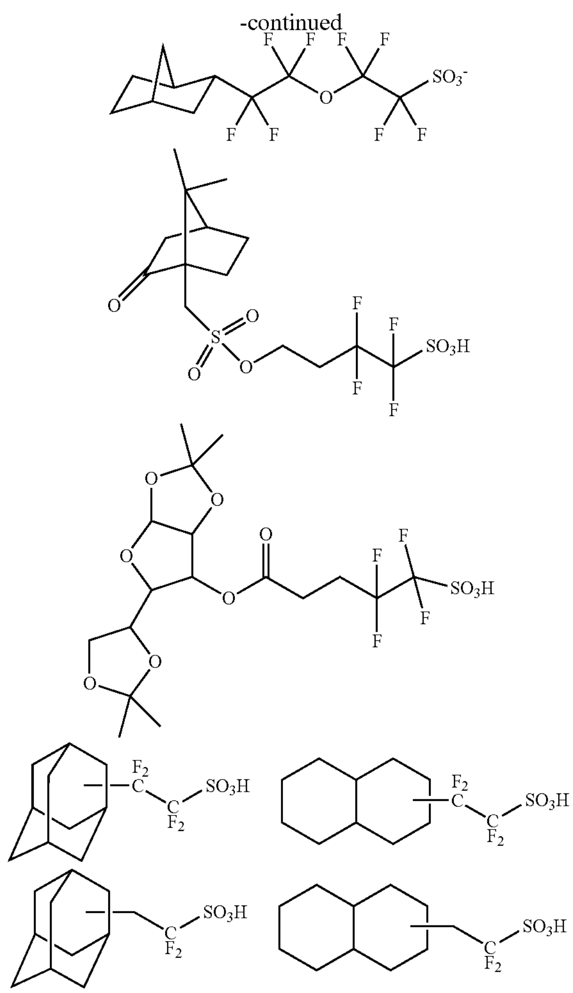

Suitable TAGs include those capable of generating a non-polymeric acid as described above. The TAG can be non-ionic or ionic. Suitable nonionic thermal acid generators include, for example, cyclohexyl trifluoromethyl sulfonate, methyl trifluoromethyl sulfonate, cyclohexyl p-toluenesulfonate, methyl p-toluene sulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, p-toluene sulfonic acid-pyridinium salts, sulfonate salts, such as carbocyclic aryl and heteroaryl sulfonate salts, aliphatic sulfonate salts, and benzenesulfonate salts. Compounds that generate a sulfonic acid upon activation are generally suitable. Preferred thermal acid generators include p-toluenesulfonic acid ammonium salts, and heteroaryl sulfonate salts.

Preferably, the TAG is ionic with a reaction scheme for generation of a sulfonic acid as shown below:

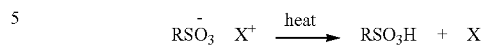

wherein $RSO_3^-$ is the TAG anion and $X^+$ is the TAG cation, preferably an organic cation. The cation can be a nitrogen-containing cation of the general formula (I):

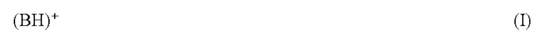
$(BH)^+$ (I)

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "pKa" is used in accordance with its art-recognized meaning, that is, pKa is the negative log (to the base 10) of the dissociation constant of the conjugate acid $(BH)^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations $(BH)^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

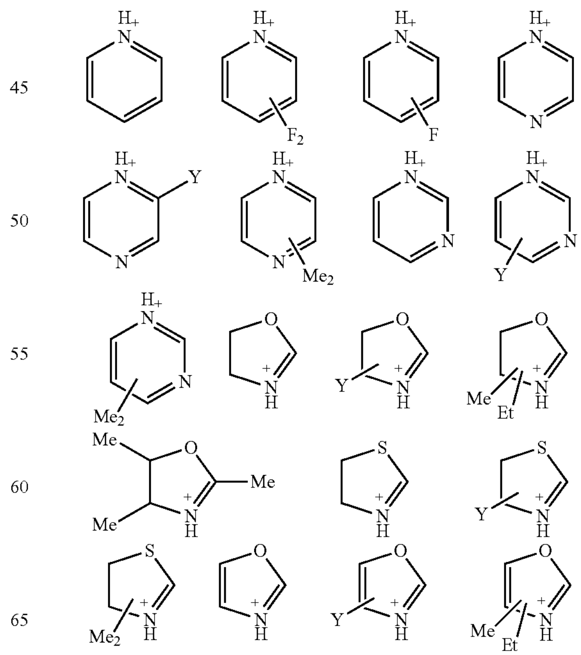

-continued

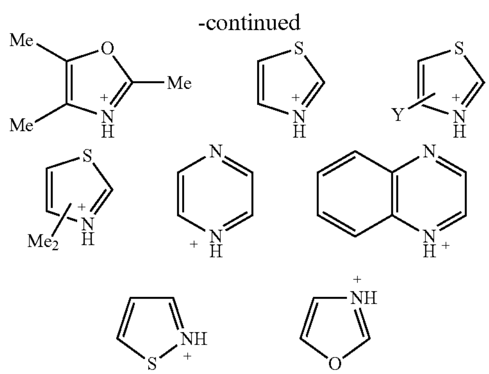

in which Y is alkyl, preferably, methyl or ethyl.

In particular embodiments, the solubility-shifting agent may be an acid such as trifluoromethanesulfonic acid, perfluoro-1-butanesulfonic acid, p-toluenesulfonic acid, 4-dodecylbenzenesulfonic acid, 2,4-dinitrobenzenesulfonic acid, and 2-trifluoromethylbenzenesulfonic acid; an acid generator such as triphenylsulfonium antimonate, pyridinium perfluorobutane sulfonate, 3-fluoropyridinium perfluorobutanesulfonate, 4-t-butylphenyltetramethylenesulfonium perfluoro-1-butanesulfonate, 4-t-butylphenyltetramethylenesulfonium 2-trifluoromethylbenzenesulfonate, and 4-t-butylphenyltetramethylenesulfonium 4,4,5,5,6,6-hexafluorodihydro-4H-1,3,2-dithiazine 1,1,3,3-tetraoxide; or a combination thereof. The acid from the solubility-shifting agent diffuses out of the first resist into the second resist to deprotect the second resist polymer in a layer adjacent to the first resist, rendering it soluble in a basic developer such as tetramethylammonium hydroxide (TMAH).

Alternatively, the second resist may be processed like an NTD resist when the solubility-shifting agent includes a base or base generator. In this case, the second resist is formulated to contain an acid or acid generator. The base from the solubility-shifting agent diffuses out of the first resist into the second resist to quench the acid in a region adjacent to the first resist, thus enabling that region to be developed by an organic solvent such as NBA. In such embodiments, suitable solubility-shifting agents include, but are not limited to, hydroxides, carboxylates, amines, imines, amides, and mixtures thereof. Specific examples of bases include ammonium carbonate, ammonium hydroxide, ammonium hydrogen phosphate, ammonium phosphate, tetramethylammonium carbonate, tetramethylammonium hydroxide, tetramethylammonium hydrogen phosphate, tetramethylammonium phosphate, tetraethylammonium carbonate, tetraethylammonium hydroxide, tetraethylammonium hydrogen phosphate, tetraethylammonium phosphate, and combinations thereof. Amines include aliphatic amines, cycloaliphatic amines, aromatic amines and heterocyclic amines. The amine may be a primary, secondary or tertiary amine. The amine may be a monoamine, diamine or polyamine. Suitable amines may include C1-30 organic amines, imines, or amides, or may be a C1-30 quaternary ammonium salt of a strong base (e.g., a hydroxide or alkoxide) or a weak base (e.g., a carboxylate). Exemplary bases include amines such as tripropylamine, dodecylamine, tris(2-hydroxypropyl)amine, tetrakis(2-hydroxypropyl)ethylenediamine; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), amides like tert-butyl 1,3-dihydroxy-2-(hydroxymethyl)propan-2-ylcarbamate and tert-butyl 4-hydroxypiperidine-1-carboxylateor; or ionic quenchers including quaternary alkyl ammonium salts such as tetrabutylammonium hydroxide (TBAH) or tetrabutylammonium lactate. In another embodiment, the amine is a hydroxyamine. Examples of hydroxyamines include hydroxyamines having one or more hydroxyalkyl groups each having 1 to about 8 carbon atoms, and preferably 1 to about 5 carbon atoms such as hydroxymethyl, hydroxyethyl and hydroxybutyl groups. Specific examples of hydroxyamines include mono-, di- and tri-ethanolamine, 3-amino-1-propanol, 2-amino-2-methyl-1-propanol, 2-amino-2-ethyl-1,3-propanediol, tris(hydroxymethyl)aminomethane, N-methylethanolamine, 2-diethylamino-2-methyl-1-propanol and triethanolamine.

Suitable base generators may be thermal base generators. A thermal base generator forms a base upon heating above a first temperature, typically about 140° C. or higher. The thermal base generator may include a functional group such as an amide, sulfonamide, imide, imine, O-acyl oxime, benzoyloxycarbonyl derivative, quaternary ammonium salt, nifedipine, carbamate, and combinations thereof. Exemplary thermal base generators include o-{(.beta.-(dimethylamino)ethyl)aminocarbonyl}benzoic acid, o-{(.gamma.-(dimethylamino)propyl)aminocarbonyl}benzoic acid, 2,5-bis{(.beta.-(dimethylamino)ethyl)aminocarbonyl}terephthalic acid, 2,5-bis{(.gamma.-(dimethylamino)propyl)aminocarbonyl}terephthalic acid, 2,4-bis{(.beta.-(dimethylamino)ethyl)aminocarbonyl}isophthalic acid, 2,4-bis{(.gamma.-(dimethylamino)propyl)aminocarbonyl}isophthalic acid, and combinations thereof.

In one or more embodiments, the solubility-shifting agent includes a solvent. As described above, in some embodiments the solubility-shifting agent is absorbed into the first relief pattern. Accordingly, the solvent may be any suitable solvent that may facilitate absorption into the first relief pattern, provided that it does not dissolve the first photoresist. The solvent is typically chosen from water, organic solvents and mixtures thereof. In some embodiments, the solvent may include an organic-based solvent system comprising one or more organic solvents. The term "organic-based" means that the solvent system includes greater than 50 wt % organic solvent based on total solvents of the solubility-shifting agent composition, more typically greater than 90 wt %, greater than 95 wt %, greater than 99 wt % or 100 wt % organic solvents, based on total solvents of the solubility-shifting agent compositions. The solvent component is typically present in an amount of from 90 to 99 wt % based on the solubility-shifting agent composition.

Suitable organic solvents for the solubility-shifting agent composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic C4-C9 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and C5-C9 fluorinated diols such as 2,2,3,3,4,4- hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents.

The solvent included in the absorbed material may depend on the composition and tone of the first resist. When the first resist is formed from a (meth)acrylate polymer, as is typical for ArF resists and the resist is developed as a PTD resist, the solvent system preferably comprises one or more polar organic solvents. For example, a solubility-shifting agent meant to be absorbed into a PTD first photoresist may include a polar solvent such as methyl isobutyl carbinol (MIBC). The solubility-shifting agent may also include aliphatic hydrocarbons, esters, and ethers as cosolvents, such as decane, isobutyl isobutyrate, isoamyl ether, and combinations thereof. In particular embodiments, the solvent includes MIBC and a cosolvent. In such embodiments, the MIBC may be included in the solvent in an amount ranging from 60 to 99%, based on the total volume of solvent. Accordingly, the cosolvent may be included in amount ranging from 1 to 40%, based on the total volume of solvent.

When the first resist is formed from a vinyl aromatic-based polymer, as is typical for KrF and EUV photoresists, and the resist is developed as a PTD resist, the solvent system preferably comprises one or more non-polar organic solvents. The term "non-polar organic-based" means that the solvent system includes greater than 50 wt % of combined non-polar organic solvents based on total solvents of the solubility-shifting agent composition, more typically greater than 70 wt %, greater than 85 wt % or 100 wt %, combined non-polar organic solvents, based on total solvents of the solubility-shifting agent composition. The non-polar organic solvents are typically present in the solvent system in a combined amount of from 70 to 98 wt %, preferably 80 to 95 wt %, more preferably from 85 to 98 wt %, based on the solvent system.

Suitable non-polar solvents include, for example, ethers, hydrocarbons, and combinations thereof, with ethers being preferred. Suitable ether solvents include, for example, alkyl monoethers and aromatic monoethers, particularly preferred of which are those having a total carbon number of from 6 to 16. Suitable alkyl monoethers include, for example, 1,4-cineole, 1,8-cineole, pinene oxide, di-n-propyl ether, diisopropyl ether, di-n-butyl ether, di-n-pentyl ether, diisoamyl ether, dihexyl ether, diheptyl ether, and dioctyl ether, with diisoamyl ether being preferred. Suitable aromatic monoethers include, for example, anisole, ethylbenzyl ether, diphenyl ether, dibenzyl ether and phenetole, with anisole being preferred. Suitable aliphatic hydrocarbons include, for example, n-heptane, 2-methylheptane, 3-methylheptane, 3,3-dimethylhexane, 2,3,4-trimethylpentane, n-octane, n-nonane, n-decane, and fluorinated compounds such as perfluoroheptane. Suitable aromatic hydrocarbons include, for example, benzene, toluene, and xylene.

In some embodiments, the solvent system further includes one or more alcohol and/or ester solvents. For certain compositions, an alcohol and/or ester solvent may provide enhanced solubility with respect to the solid components of the composition. Suitable alcohol solvents include, for example: straight, branched or cyclic C4-9 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol, 4-octanol, 2,2,3,3,4,4-hexafluoro-1-butanol, 2,2,3,3,4,4,5,5-octafluoro-1-pentanol, and 2,2,3,3,4,4,5,5,6,6-decafluoro-1-hexanol; and C5-9 fluorinated diols such as 2,2,3,3,4,4-hexafluoro-1,5-pentanediol, 2,2,3,3,4,4,5,5-octafluoro-1,6-hexanediol, and 2,2,3,3,4,4,5,5,6,6,7,7-dodecafluoro-1,8-octanediol. The alcohol solvent is preferably a C4-9 monohydric alcohol, with 4-methyl-2-pentanol being preferred. Suitable ester solvents include, for example, alkyl esters having a total carbon number of from 4 to 10, for example, alkyl propionates such as n-butyl propionate, n-pentyl propionate, n-hexyl propionate, and n-heptyl propionate, and alkyl butyrates such as n-butyl butyrate, isobutyl butyrate, and isobutyl isobutyrate. The one or more alcohol and/or ester solvents if used in the solvent system are typically present in a combined amount of from 2 to 50 wt %, more typically in an amount of from 2 to 30 wt %, based on the solvent system.

The solvent system can also include one or more additional solvents chosen, for example, from one or more of: ketones such as 2,5-dimethyl-4-hexanone and 2,6-dimethyl-4-heptanone; and polyethers such as dipropylene glycol monomethyl ether and tripropylene glycol monomethyl ether. Such additional solvents, if used, are typically present in a combined amount of from 1 to 20 wt % based on the solvent system.

When the first resist is formed from a vinyl aromatic-based polymer, a particularly preferred organic-based solvent system includes one or more monoether solvents in a combined amount of from 70 to 98 wt % based on the solvent system, and one or more alcohol and/or ester solvents in a combined amount of from 2 to 30 wt % based on the solvent system. The solvent system is typically present in the overcoat composition in an amount of from 90 to 99 wt %, preferably from 95 to 99 wt %, based on the overcoat composition.

In one or more embodiments, the first resist is a NTD resist, and the solvent is a nonpolar organic solvent. Suitable nonpolar organic solvents include, but are not limit to, n-butyl acetate, 2-heptanone, propylene glycol methyl ether, propylene glycol methyl ether acetate, and combinations thereof.

In some embodiments, the solubility-shifting agent is coated over the first relief pattern. To properly coat the first relief pattern, the solubility-shifting agent may include a matrix polymer. The matrix polymer allows for the compositions to be coated over the resist pattern in the form of a layer having a desired thickness. This will help to ensure the presence of a sufficient content of the solubility-shifting agent for interaction with the first resist surface. Any matrix polymer commonly used in the art may be included in the solubility-shifting material. The matrix polymer should have good solubility in a solvent that does not dissolve the first resist. The matrix polymer can be formed from one or more monomers chosen, for example, from those having an ethylenically unsaturated polymerizable double bond, such as: (meth)acrylate monomers such as isopropyl(meth)acrylate and n-butyl(meth)acrylate; (meth)acrylic acid; vinyl aromatic monomers such as styrene, hydroxystyrene, vinyl naphthalene and acenaphthylene; vinyl alcohol; vinyl chloride; vinyl pyrrolidone; vinyl pyridine; vinyl amine; vinyl acetal; maleic anhydride; maleimides; norbornenes; and combinations thereof. In some embodiments, the polymer contains one or more functional groups chosen, for example, from hydroxy, acid groups such as carboxyl, sulfonic acid and sulfonamide, silanol, fluoroalcohol such as hexafluoroisopropyl alcohol [—C(CF3)2OH], anhydrates, lactones, esters, ethers, allylamine, pyrrolidones and combinations thereof. The polymer can be a homopolymer or a copolymer having a plurality of distinct repeat units, for example, two, three, four or more distinct repeat units. In one aspect, the repeat units of the polymer are all formed from (meth) acrylate monomers, are all formed from (vinyl)aromatic monomers or are all formed from (meth)acrylate monomers and (vinyl)aromatic monomers. When the polymer includes more than one type of repeat unit, it typically takes the form of a random copolymer. In particular embodiments, the matrix polymer may be a t-butyl acrylate (TBA)/p-hydroxystyrene (PHS) copolymer, a butyl acrylate (BA)/PHS copolymer, a TBA/methacrylic acid (MAA) copolymer, a BA/MAA copolymer, a PHS/methacrylate (MA) copolymer, and combinations thereof.

The solubility-shifting agent compositions typically include a single polymer but can optionally include one or more additional polymers. The content of the polymer in the composition will depend, for example, on the target thickness of the layer, with a higher polymer content being used when thicker layer is desired. The polymer is typically present in the pattern solubility-shifting agent composition in an amount of from 80 to 99.9 wt %, more typically from 90 to 99 wt %, or 95 to 99 wt %, based on total solids of the solubility-shifting agent composition. The weight average molecular weight (Mw) of the polymer is typically less than 400,000, preferably from 3000 to 50,000, more preferably from 3000 to 25,000, as measured by GPC versus polystyrene standards. Typically, the polymer will have a polydispersity index (PDI=Mw/Mn) of 3 or less, preferably 2 or less, as measured by GPC versus polystyrene standards.

Suitable polymers for use in the solubility-shifting agent compositions are commercially available and/or can readily be made by persons skilled in the art. For example, the polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the polymer include, for example, toluene, benzene, tetrahydrofuran, diethyl ether, dioxane, ethyl lactate and methyl isobutyl carbinol. Suitable polymerization initiators include, for example, 2,2'-azobisisobutyronitrile (AIBN), 2,2'-azobis(2,4-dimethylvaleronitrile), dimethyl 2,2-azobis(2-methylpropionate), benzoyl peroxide and lauroyl peroxide.

Solubility-shifting agents including a matrix polymer may be coated over the first relief pattern according to methods known in the art. Typically, a solubility-shifting agent that includes a matrix polymer may coated over the first relief pattern by spin coating. The solids content of the solubility-agent may be tailored to provide a film of a desired thickness of the solubility-shifting agent over the first relief pattern. For example, the solids content of the solubility-shifting agent solution can be adjusted to provide a desired film thickness based upon the specific coating equipment utilized, the viscosity of the solution, the speed of the coating tool and the amount of time allowed for spinning. A typical thickness for the composition is from about 200 Å to about 1500 Å.

In one or more embodiments, a solubility-shifting agent includes an active material (i.e., and acid, acid generator, base, or base generator), a solvent, and a matrix polymer as previously described. A typical formulation for such solubility-shifting agent may include about 1 wt % to about 10 wt % solids and about 90 wt % to about 99 wt % solvent, based on the total weight of the solubility shifting agent, where the solids include the active material and the matrix polymer. Within the solids content, the active material may be included in an amount ranging from about 1 wt % to about 5 wt %.

The solubility-shifting agent may include additives having various purposes, depending on the particular chemistry being used. In some embodiments, a surfactant may be included in the solubility-shifting agent. A surfactant may be included in the solubility-shifting agent to help with coating quality, especially when needing to fill thin gaps between features of the first resist. Any suitable surfactant known in the art may be included in the solubility-shifting agent.

As noted above, in one or more embodiments, the solubility-shifting agent is diffused into the first relief pattern such that it is included in the first resist as an absorbed material. Diffusion of the solubility-shifting agent into the first relief pattern may be achieved by performing a thermal pretreatment such as a bake. The bake may be a soft bake. The temperature and time of the soft bake may depend on the identity of the first resist, and the desired amount of diffusion of the solubility-shifting agent into the first resist. Typically, a soft bake may be performed for about 30 second to about 90 seconds at a temperature ranging from about 50° C. to about 150° C.

After diffusion into the first resist, a coating layer that does not include any active solubility-shifting material, may remain on the first resist. In one or more embodiments, the coating layer may be removed by a rinse. The rinse may be accomplished by rinsing the coated substrate with a solvent that dissolves the coating layer but does not dissolve the first resist. The rinse may be carried out using any suitable method, for example, by dipping a substrate in a bath filled with the solvent for a fixed time (dip method), by raising the solvent on a substrate surface by the effect of a surface tension and keeping it still for a fixed time, thereby dissolving the coating layer (puddle method), by spraying the solvent on a substrate surface (spray method), or by continuously ejecting the solvent on a substrate rotating at a constant speed while scanning the solvent ejecting nozzle at a constant rate (dynamic dispense method).

At block 306 of method 300, a second resist or solubility-shiftable polymer is deposited on the substrate. A coated substrate layered with a first relief pattern 404, a solubility-shifting agent 405, and a second resist 406 is shown in FIG. 4C. The second resist may be deposited on the substrate such that it fills gaps of the first relief pattern and is in contact with the first relief pattern or the solubility-shifting agent. In one or more embodiments, the second resist completely covers the substrate, the first relief pattern, and the solubility-shifting agent. The second resist may be deposited on the substrate according to any suitable method known in the art such as, for example, spin-on deposition or vapor-phase treatment.

Suitable second resist compositions include those listed above with respect to first resist compositions. In one or more embodiments, the second resist includes a polymer as previously described. The second resist may be different from the first resist. For example, when the first resist is an organic-based resist, the second resist may be metal or silicon-based. Likewise, if the first resist is a metal-based resist, the second resist may be silicon-based. In one or more embodiments, the second resist may have a second etch selectivity, such that it may be etched more or less easily than the first resist. In some embodiments, the second resist does not include an etch resistance enhancer.

The polymer included in the second resist may have a weight average molecular weight (Mw) ranging from about 2,000 g/mol to about 20,000 g/mol. For example, in one or more embodiments, the second resist may include a polymer having a Mw ranging from a lower limit of one of about 2,000 g/mol, about 2,500 g/mol, about 3,000 g/mol, about 3,500 g/mol, about 4,000 g/mol and about 5,000 g/mol to an upper limit of one of about 5,000 g/mol, about 7,500 g/mol, about 10,000 g/mol, about 12,500 g/mol, about 15,000 g/mol, about 17,500 g/mol, and about 20,000 g/mol, where any lower limit may be paired with any mathematically compatible upper limit. A polymer having such Mw may exhibit desired solubility characteristics, such as, in particular, the dissolution rate.

In one or more embodiments, the second resist includes a base. In such embodiments, a base may be included in the second resist in an amount ranging from 0.01 wt % to 1.0 wt %, based on the total weight of the second resist. Suitable bases include those listed above with respect to base solubility-shifting agents.

In one or more embodiments, the second resist includes a photoacid selected from those listed above with respect to the first resist composition.

In embodiments in which the solubility-shifting agent includes a base or base generator and the first resist may be processed like an NTD resist, the second resist includes an acid and/or acid generator. The acid or acid generator may be as previously described with respect to the acid or acid generator included in the solubility-shifting agent.

At block 308 of method 300, the solubility-shifting agent is diffused into the second resist. In one or more embodiments, diffusion of the solubility-shifting agent into the second resist is achieved by performing a bake. The bake may be carried out with a hotplate or oven. The temperature and time of the bake may depend on the identity of the second resist, and the desired amount of diffusion of the solubility-shifting agent into the second resist. Suitable conditions for the bake may include a temperature ranging from 50° C. to 160° C., and a time ranging from about 30 second to about 90 seconds.

In one or more embodiments, after the bake, a solubility-shifted region is present around the edges of the second resist. The amount of diffusion of the solubility-shifting agent may correspond to the thickness of the solubility-shifted region. In some embodiments, the solubility-shifted region extends into the second resist such that it has a thickness of about 5 nm to about 60 nm. For example, the thickness of the solubility-shifted region may range from a lower limit of one of 5 nm, 10 nm, 15 nm, 20 nm, and 25 nm to an upper limit of one of 40 nm, 45 nm, 50 nm, 55 nm, and 60 nm, where any lower limit may be paired with any mathematically compatible upper limit. In one or more embodiments, the thickness of the solubility-shifted region may correspond to the desired width of the line that is to be cut into the substrate.

A coated substrate including a solubility-shifted region is shown in FIG. 4D. As shown in FIG. 4D, the coated substrate includes a target layer 402. The substrate is as previously described. The first relief pattern 404, comprised of the first resist 203, is on top of the target layer 402. The first relief pattern 404 is coated with the solubility shifting agent. The second resist 406 is coated over the first relief pattern and the substrate. In one or more embodiments, the second resist 406 completely covers the substrate 202 and the first relief pattern 204. A solubility-shifted region 408 of the second resist is shown bordering the first relief pattern.

The solubility-shifted region may have a different solubility than the region of the second resist that was unexposed to the solubility-shifting agent. As such, the solubility-shifted region and the unexposed region of the second resist may be soluble in different resist developers.

At block 310 of method 300, the deposited layer of second resist may be developed using a specific developer such that the unexposed region of the second resist remains. In one or more embodiments, the solubility-shifted region of the second resist is developed by first being exposed to actinic radiation, and then being exposed to a specific developer. In other embodiments, the solubility-shifted region of the second resist is only exposed to the specific developer. The specific developer may depend on the tone of the second resist. For example, if the solubility-shifting agent is an acid or acid-generator, the specific developer may be a base such as tetramethylammonium hydroxide. On the other hand, if the solubility-shifting agent includes a base or base generator, the specific developer may be an organic solvent, such as n-butyl acetate or 2-heptanone.

The thickness of the solubility-shifted region may correspond to the desired width of a line of the pattern to be cut into the substrate. FIG. 4E shows a coated substrate that has been developed according to embodiments of the present disclosure. In one or more embodiments, the second resist 406 is developed so as to dissolve the solubility-shifted region, which is between the first relief pattern and the second resist. Accordingly, dissolution of the solubility-shifted region may result in the formation of trenches 410 between the first relief pattern 404 and the second resist 406 in which the target layer 402 is exposed. In some embodiments, an etch may be performed at this stage to transfer the pattern of trenches 410 into the target layer 402.

At block 312, method 300 includes filling the gaps formed between the second resist and the first relief pattern with a fill material. Suitable fill material may be polysilicon, such as copper (Cu), nickel (Ni), cobalt (Co), iron (Fe), manganese (Mn), chromium (Cr), titanium (Ti), tantalum (Ta), ruthenium (Ru), palladium (Pd), tungsten (W), and various alloys, stacks, or other combinations thereof, oxides of silicon (e.g., silicon dioxide (SiO2)), doped oxides of silicon, fluorinated oxides of silicon, carbon doped oxides of silicon, nitrides of silicon (e.g., silicon nitride (SiN)), carbides of silicon (e.g., silicon carbide (SiC)), carbo-nitrides of silicon (e.g., SiCN), oxides of aluminum (e.g., aluminum oxide (Al2O3)), oxides of titanium (e.g., titanium oxide (TiO2)), oxides of zirconium (e.g., zirconium oxide (ZrO2)), oxides of hafnium (e.g., hafnium oxide (HfO2)), a silicon antireflection coating, a spin-on metal hard mask, various low-k dielectric materials known in the arts, and combinations thereof, to name just a few illustrative examples. The fill materials may be applied using solution phase techniques such as spin coating or vapor phase techniques such as chemical vapor deposition, atomic layer deposition, molecular layer deposition. In one or more embodiments, the fill material may have a third etch selectivity, such that it may be etched more or less easily than the first resist and the second resist.

Any overburden may then be removed using chemical-mechanical planarization to provide an ABC patterned multiline layer. FIG. 4F shows an exemplary ABC patterned multiline layer. In FIG. 4F, a target layer 402 is coated with a first resist 403, a second resist 406, and a fill material 412, such that the fill material is in every other position and the first and second resist alternatingly occupy the space between the fill material.

Method 300 represents one possible embodiment and is not intended to limit the scope of the present invention. As will be appreciated by one of ordinary skill in the art, the present invention may encompass various alternative methods, such as, for example, methods in which the solubility-shifting agent is diffused into the first resist rather than the second resist. In such alternate embodiments, the components and techniques used in the methods may be as previously described with reference to method 300.

As mentioned above, in one or more embodiments, the solubility-shifting agent is diffused into the first resist. In such embodiments, a method may include initially forming a first relief pattern of a first resist and then coating the first resist with a solubility-shifting agent. At this point, the solubility-shifting agent may be diffused into the first resist a predetermined distance to provide a solubility-shifted region of the first resist. While diffusion of the solubility-shifting agent may occur at a different point in such method and into a different component, diffusion of the solubility-shifting agent may be carried out as descried above in method 100. After the solubility-shifting agent is diffused into the first resist, the second resist may be deposited on the substrate. Then, the method may continue according to method 300.

Further, while method 300 ends with an ABC multiline pattern including a first resist, a second resist, and a fill material, alternate methods may continue by selectively removing one material and replacing it with a replacement material. As will be appreciated by one of ordinary skill in the art, any of the first resist, the second resist, and the fill material may be removed by a targeted developer, rinse, or other method, and replaced with a suitable replacement material. A suitable replacement material may be a different resist or fill material that has a fourth etch selectivity, that is either more or less etch selective than the first and second resist and the fill material.

In one or more embodiments, processing may be continued using an AB patterned multilayer line. In some embodiments, additional processing may include repeating various steps of method 300 to provide an ABC patterned multilayer line.

Figure 5:
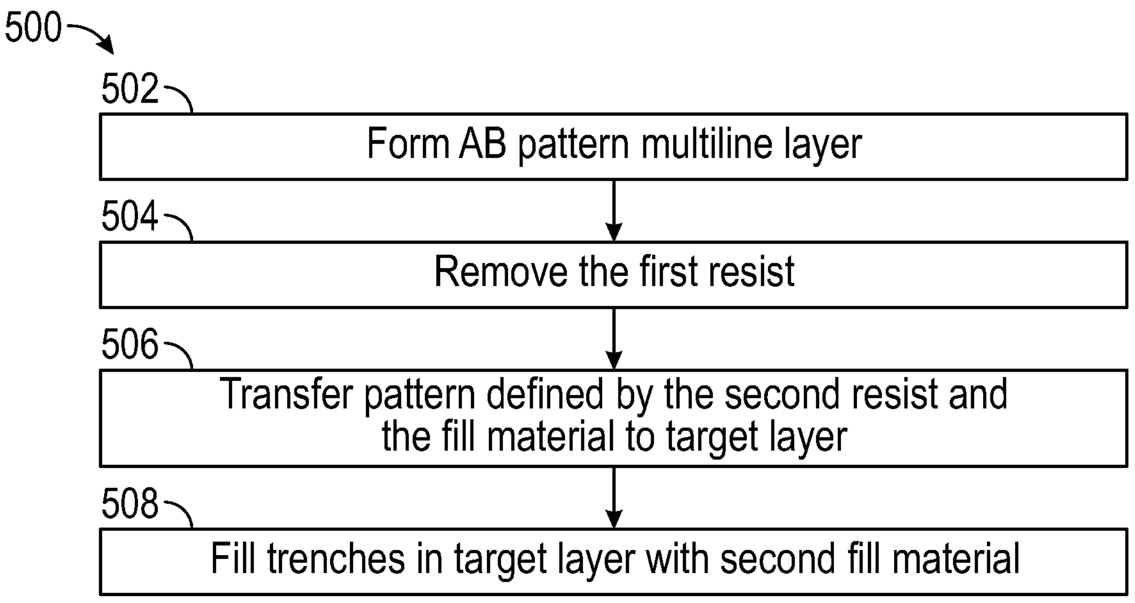
FIG. 5 is a block-flow diagram of a method in accordance with one or more embodiments of the present disclosure.
Figure 6A:
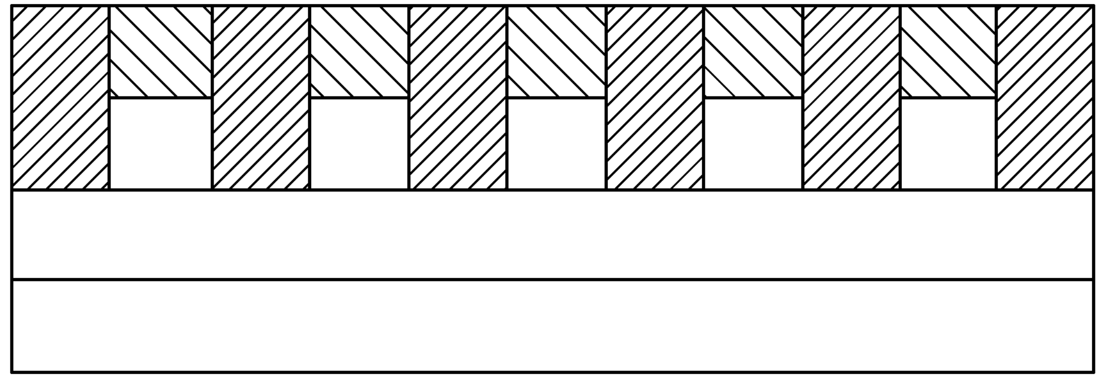
FIGS. 6A-D are schematic illustrations of coated substrates at respective points of a method in accordance with one or more embodiments of the present disclosure.

Another method, 500, of providing an ABC patterned multiline layer in accordance with the present disclosure is shown in FIG. 5. Schematic illustrations of coated substrates at respective points in method 500 are shown in FIGS. 6A-D. In method 500, at block 502, an AB patterned multiline layer is provided on a target layer according to method 300, referring back to FIG. 3. As will be appreciated by one of ordinary skill in the art, components and methods used in method 300 may be applied to method 600 as described with reference to method 300. In FIG. 6A, a coated substrate is shown with an intermediate target layer underlying the AB patterned multiline layer.

Figure 6B:
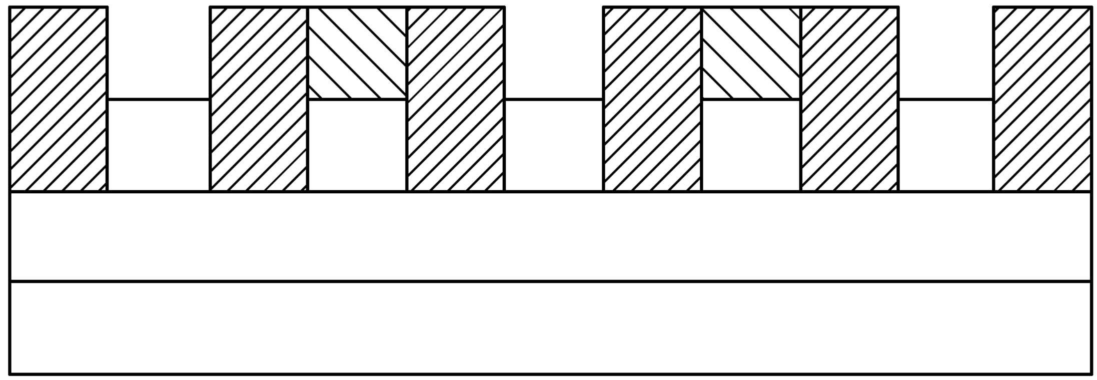
Figure 6C:
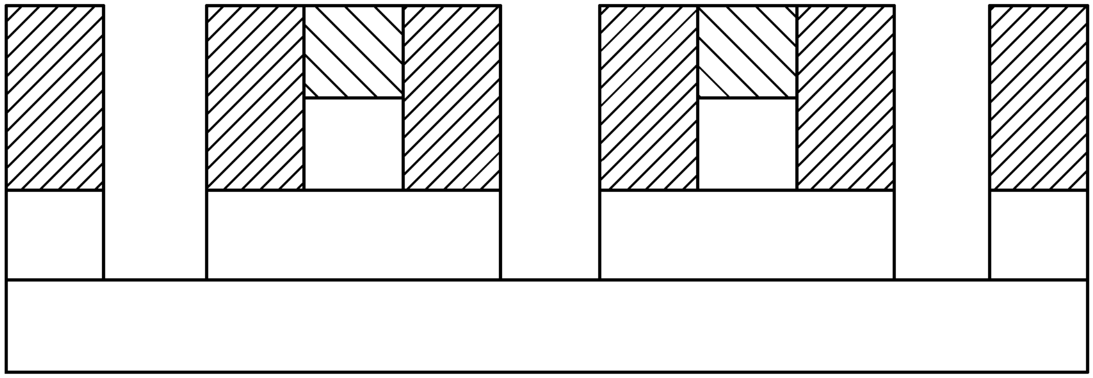
Figure 6D:
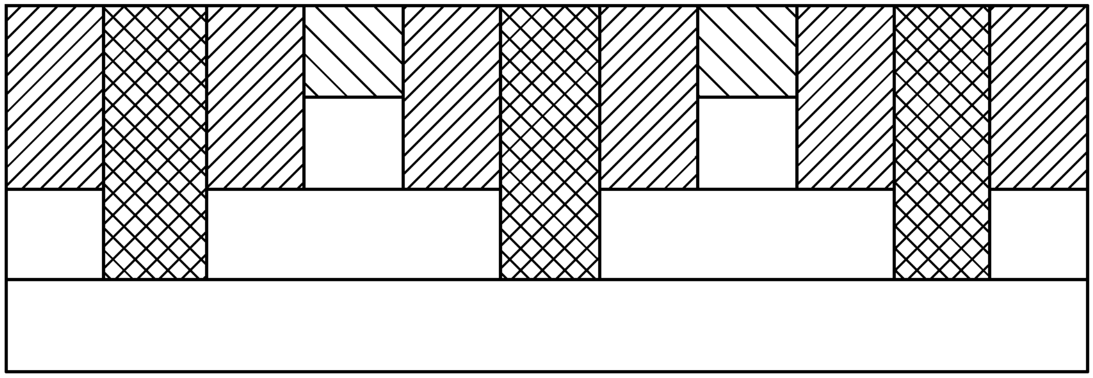

At block 504, the first resist may be removed. The first resist may be removed according to techniques known in the art. In one or more embodiments, the first resist is removed by performing a rinse, a wet chemical etch, or a dry etch process. Removal of the first resist may provide a pattern defined by the second resist and the fill material that includes trenches between the fill material where the target layer is exposed, as shown in FIG. 6B. Then, at block 506 of method 500, the pattern defined by the second resist and the fill material is transferred to the underlying target layer such that trenches are formed in the underlying target layer, shown in FIG. 6C. Finally, at block 510, the trenches in the underlying target layer are filled with a second fill material to provide an ABC patterned multiline layer. An exemplary ABC patterned multiline layer is shown in FIG. 6D.

As will be appreciated by one of ordinary skill in the art, although method 500 includes removing the first resist to provide a relief pattern defined by the second resist and the fill material, alternative embodiments may include removing the second resist to provide a relief pattern defined by the first resist and the fill material. In such embodiments, after removal of the second resist, methods may proceed as described above in method 500.

In one or more embodiments, after filling with the fill material, the first and second resists are removed and replaced with a replacement material. The replacement material may be a material selected from the fill materials described herein. Any overburden of the replacement material can be etched or planarized to a top of the fill material to complete a multiline layer for continued patterning.

Methods and systems of one or more embodiments, in relying on both chemical processes and diffusional properties, provide the unique ability to add control features to the input chemistry itself, and the process of measuring such chemistry.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:

1. A method of microfabrication comprising:

providing a first relief pattern on a target layer, wherein the first relief pattern comprises a first resist having a first etch selectivity;

coating the first relief pattern with a solubility-shifting agent;

depositing a second resist on the first relief pattern such that the second resist is in contact with the first relief pattern, wherein the second resist has a second etch selectivity that is different from the first etch selectivity;

diffusing the solubility-shifting agent a predetermined distance into the second resist to provide a solubility-shifted region of the second resist, wherein the solubility-shifted region of the second resist borders the first relief pattern;

developing the second resist such that the solubility-shifted region is dissolved providing gaps between the first relief pattern and the second resist where a portion of the target layer is exposed; and filling the gaps between the first relief pattern and the second resist with a fill material, wherein the method further comprises:

removing the first relief pattern;

transferring a pattern defined by the second resist and the fill material into the target layer; and filling the target layer with a second fill material.

2. The method of claim 1, wherein the target layer is an intermediate layer on top of a substrate.

3. The method of claim 1, further comprising:

prior to filling the gaps between the first relief pattern and the second resist, transferring a pattern defined by the first relief pattern and the second resist to the target layer; and filling the gaps of the target layer with the fill material.

4. The method of claim 1, wherein the first relief pattern comprises features separated by gaps between the features, wherein the features comprise the first resist.

5. The method of claim 4, wherein the second resist fills the gaps of the first relief pattern.

6. The method of claim 1, further comprising removing materials above the target layer.

7. The method of claim 1, further comprising:
removing the second resist;
transferring a pattern defined by the first resist and the fill material into the target layer; and
filling the target layer with a second fill material.

8. The method of claim 1, further comprising, directly after coating the first relief pattern with the solubility-shifting agent, diffusing the solubility-shifting agent into the first relief pattern.

9. The method of claim 8, wherein diffusing the solubility-shifting agent into the first relief pattern is achieved by performing a bake.

10. A method of microfabrication comprising:
providing a first relief pattern on a target layer, wherein the first relief pattern comprises a first resist having a first etch selectivity;
coating the first relief pattern with a solubility-shifting agent;
diffusing the solubility-shifting agent a predetermined distance into the first resist to provide a solubility-shifted region of the first resist;
depositing a second resist on the first relief pattern such that the second resist is in contact with the first relief pattern, wherein the second resist has a second etch selectivity that is different from the first etch selectivity;
developing the first resist such that the solubility-shifted region is dissolved providing gaps between the first relief pattern and the second resist where a portion of the target layer is exposed; and
filling the gaps between the first relief pattern and the second resist with a fill material,
the method further comprising:
removing the first relief pattern;
transferring a pattern defined by the second resist and the fill material into the target layer; and
filling the target layer with a second fill material.

11. The method of claim 10, wherein the target layer is an intermediate layer on top of a substrate.

12. The method of claim 10, further comprising:
prior to filling the gaps between the first relief pattern and the second resist, transferring a pattern defined by the first relief pattern and the second resist to the target layer; and
filling the gaps of the target layer with the fill material.

13. The method of claim 10, wherein the first relief pattern comprises features separated by gaps between the features, wherein the features comprise the first resist.

14. The method of claim 13, wherein the second resist fills the gaps of the first relief pattern.

15. The method of claim 10, further comprising removing materials above the target layer.

16. The method of claim 10, further comprising:
removing the second resist;
transferring a pattern defined by the first resist and the fill material into the target layer; and
filling the target layer with a second fill material.

17. The method of claim 10, further comprising, directly after coating the first relief pattern with the solubility-shifting agent, diffusing the solubility-shifting agent into the first relief pattern.

18. The method of claim 17, wherein diffusing the solubility-bility-shifting agent into the first relief pattern is achieved by performing a bake.

* * * * *